(12) United States Patent
Kamohara et al.

(10) Patent No.: US 11,391,389 B2
(45) Date of Patent: Jul. 19, 2022

(54) SEMICONDUCTOR DEVICE

(71) Applicant: RENESAS ELECTRONICS CORPORATION, Tokyo (JP)

(72) Inventors: Shiro Kamohara, Tokyo (JP); Kazuya Uejima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 191 days.

(21) Appl. No.: 16/820,130

(22) Filed: Mar. 16, 2020

(65) Prior Publication Data
US 2020/0309282 A1 Oct. 1, 2020

(30) Foreign Application Priority Data

Mar. 25, 2019 (JP) .............................. JP2019-056603

(51) Int. Cl.
| | |
|---|---|
| *F16K 31/06* | (2006.01) |
| *H01F 7/08* | (2006.01) |
| *H01F 7/06* | (2006.01) |
| *H01F 7/02* | (2006.01) |
| *H01F 27/24* | (2006.01) |
| *H01F 27/28* | (2006.01) |

(Continued)

(52) U.S. Cl.
CPC ........... *F16K 31/0675* (2013.01); *H01F 7/02* (2013.01); *H01F 7/064* (2013.01); *H01F 7/081* (2013.01); *H01F 27/24* (2013.01); *H01F 27/28* (2013.01); *H01L 27/0928* (2013.01); *H01L 27/1207* (2013.01)

(58) Field of Classification Search
CPC ............... F16K 31/0675; F16K 31/082; F16K 37/0083; H01F 7/02; H01F 7/064; H01F 7/081; H01F 7/1844; H01F 27/24; H01F 27/28; H01F 2007/185; H01L 27/0928; H01L 27/1207; H01L 27/0922
See application file for complete search history.

(56) References Cited

U.S. PATENT DOCUMENTS

| | | | |
|---|---|---|---|
| 6,949,923 B2 * | 9/2005 | Schultz ................. | H01F 7/1844 324/207.18 |
| 8,681,468 B2 * | 3/2014 | Jacob ................... | H01F 7/1805 361/154 |

(Continued)

FOREIGN PATENT DOCUMENTS

JP 59-171803 A 9/1984

*Primary Examiner* — Matthew W Jellett
(74) *Attorney, Agent, or Firm* — McDermott Will & Emery LLP

(57) ABSTRACT

The semiconductor device controls the first circuit for supplying/stopping the current supplied by a DC power supply to the latching solenoid consisting of a coil and a movable iron core and a permanent magnet, the current is measured based on the input from the current detection circuit. The semiconductor device includes a control circuit having a low power dissipation mode in which the leakage current is reduced, and a normal operation mode. The control circuit maintains the low power consumption mode when no current is flowing through the coil, when a current is flowing through the coil maintains the normal operation mode, further, the movable iron core It comprises a control circuit configured to detect the inflection point of the current detected by the current detection circuit when leaving the permanent magnet.

17 Claims, 23 Drawing Sheets

(51) Int. Cl.
*H01L 27/12* (2006.01)
*H01L 27/092* (2006.01)

(56) References Cited

U.S. PATENT DOCUMENTS

| | | | | |
|---|---|---|---|---|
| 9,773,602 | B2* | 9/2017 | Vopel | F01L 1/047 |
| 10,253,900 | B2* | 4/2019 | Jefford | F16K 21/14 |
| 10,317,453 | B2* | 6/2019 | Narayanasamy | H01F 7/1844 |
| 10,488,173 | B2* | 11/2019 | Sugawara | F01L 13/0036 |
| 10,895,608 | B2* | 1/2021 | Narayanasamy | G01D 5/006 |

\* cited by examiner

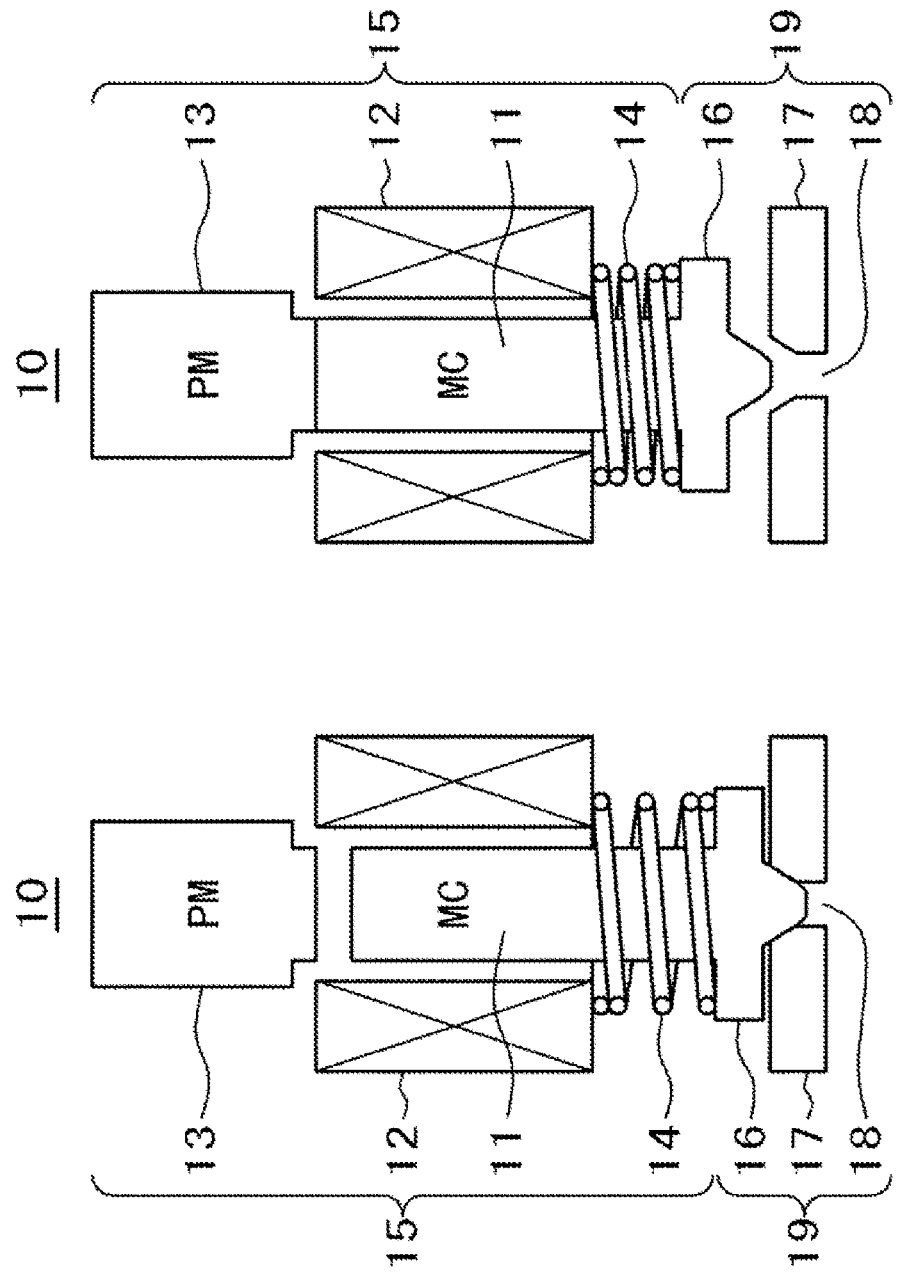

FIG. 2A
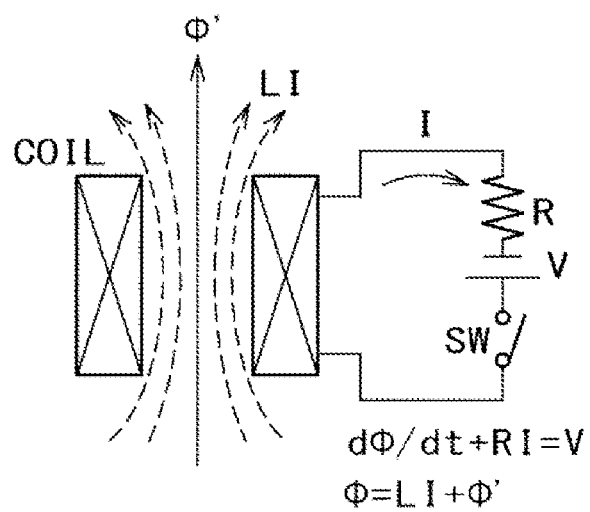
FIG. 2B
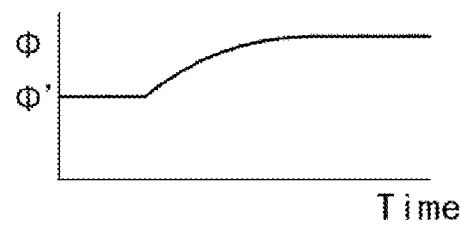
FIG. 2C
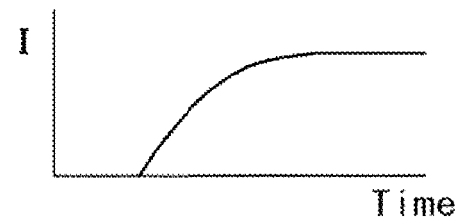
FIG. 2D
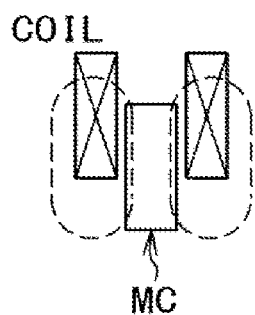
FIG. 2F
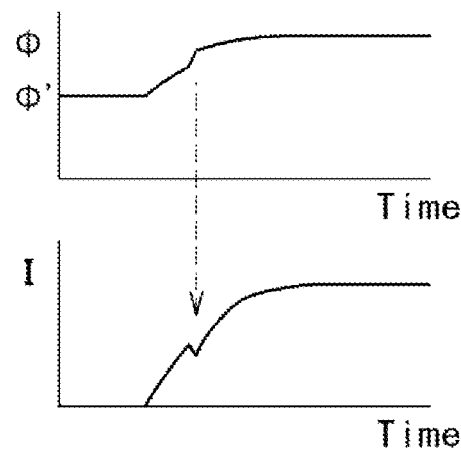
FIG. 2E
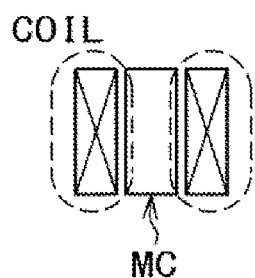
FIG. 2G FIG. 3A
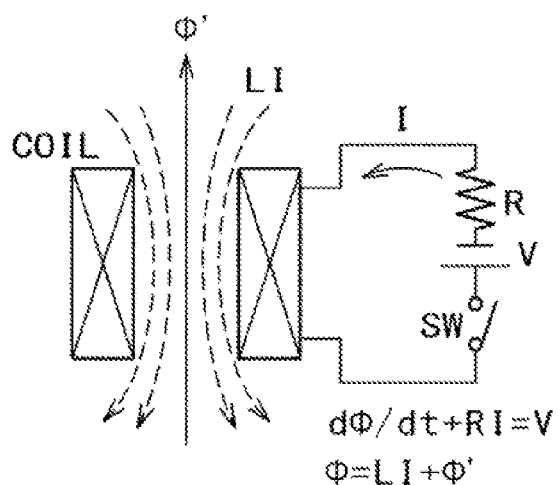
FIG. 3B
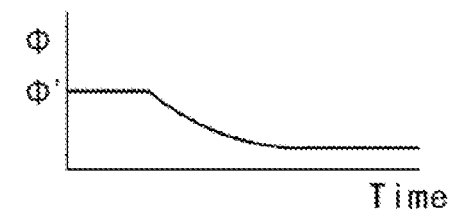
FIG. 3C
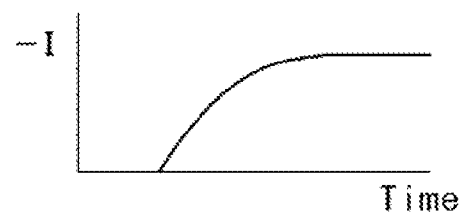
FIG. 3D
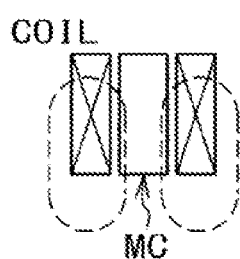
FIG. 3F
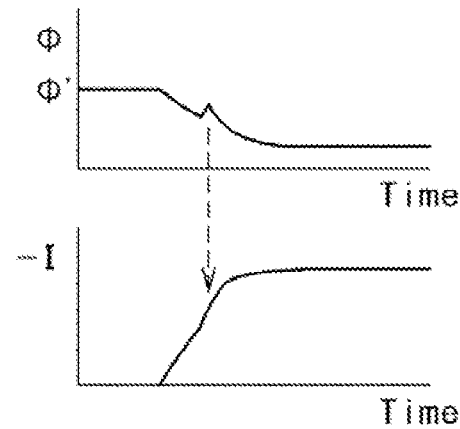
FIG. 3E
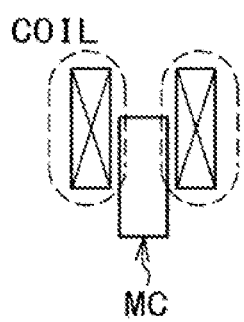
FIG. 3G FIG. 11A
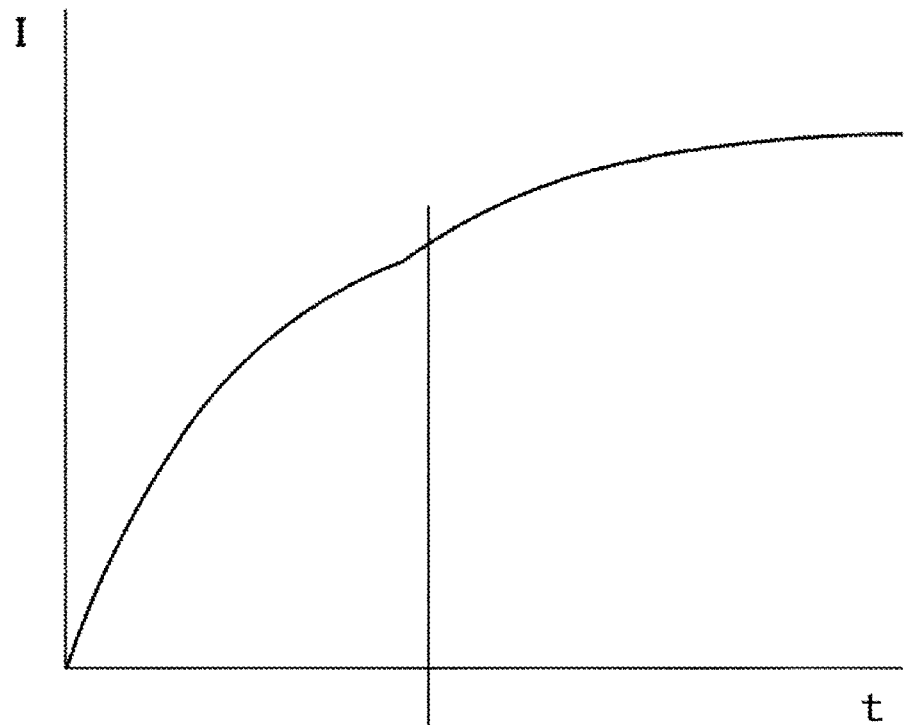
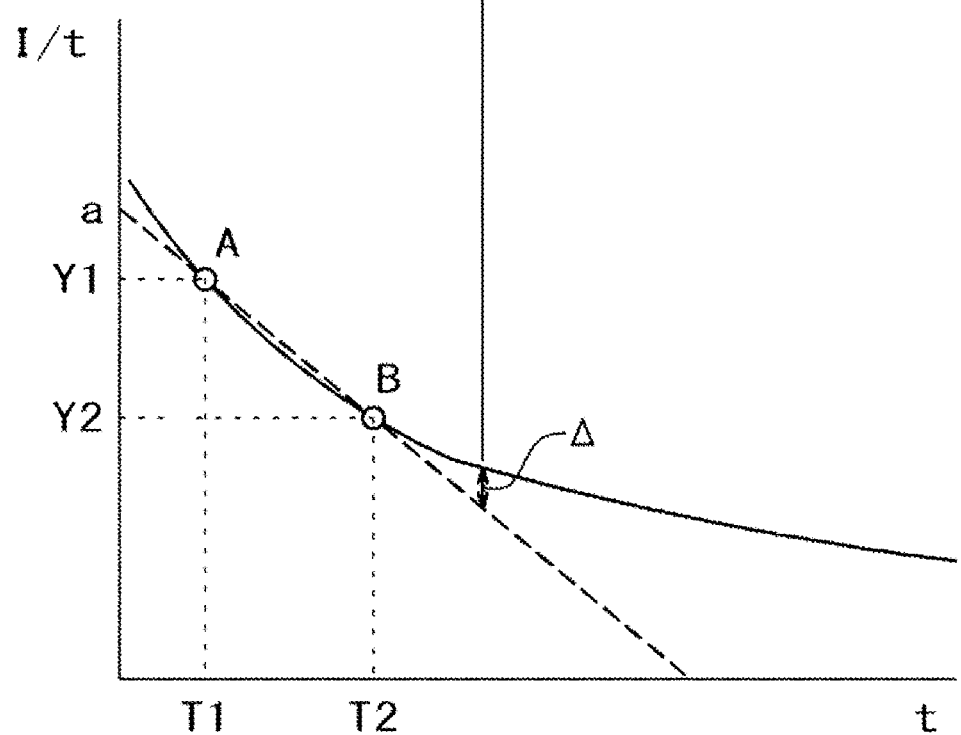
FIG. 11B FIG. 15A
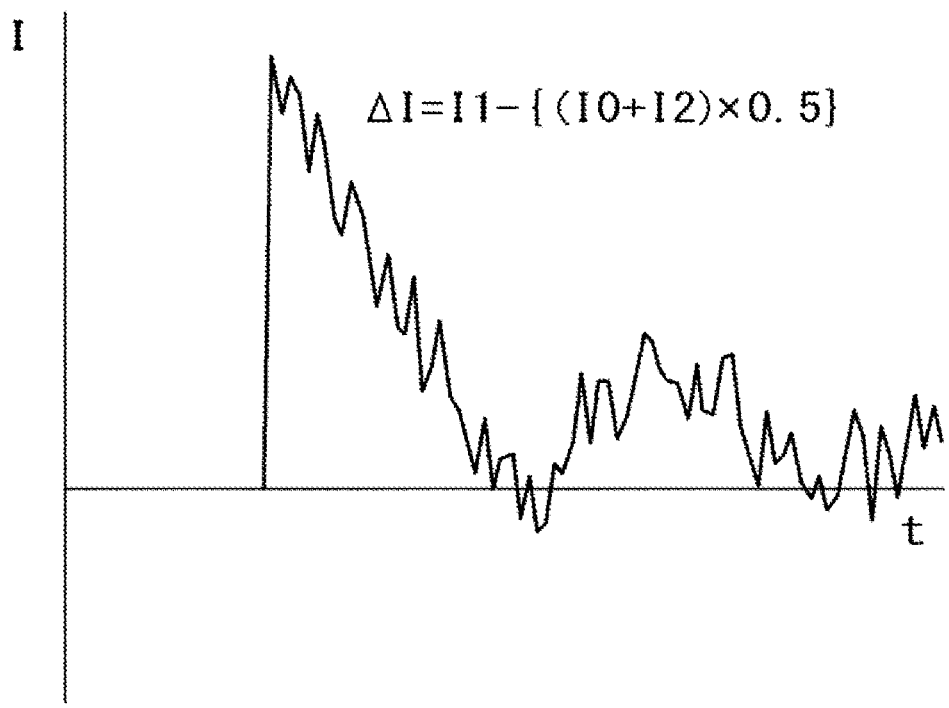
FIG. 15B FIG. 16A
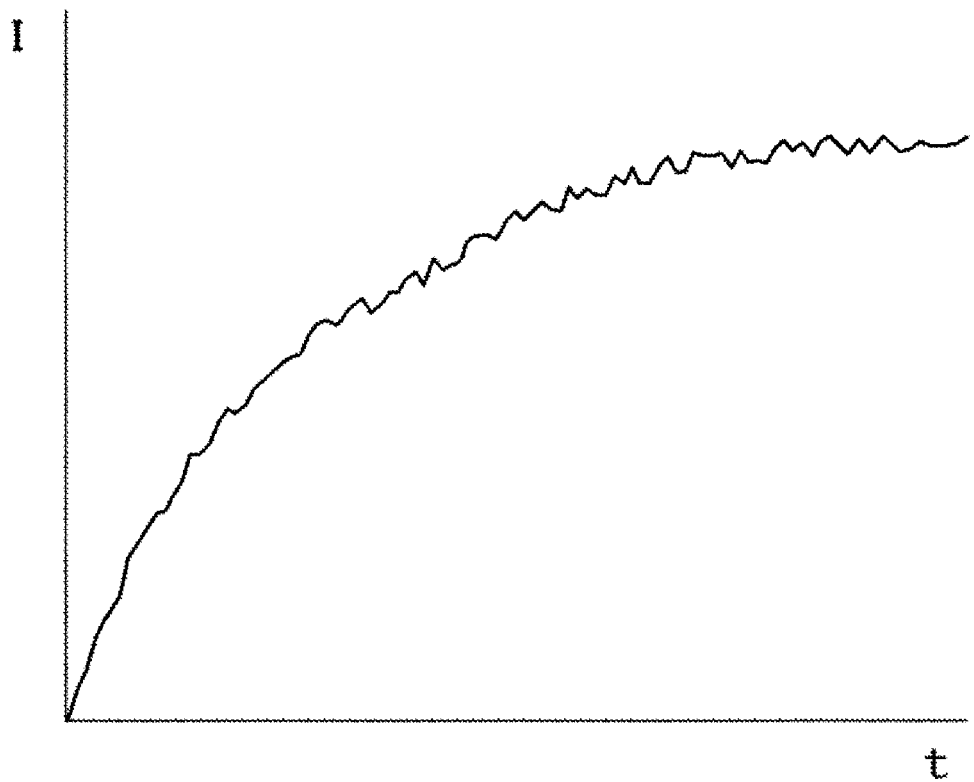
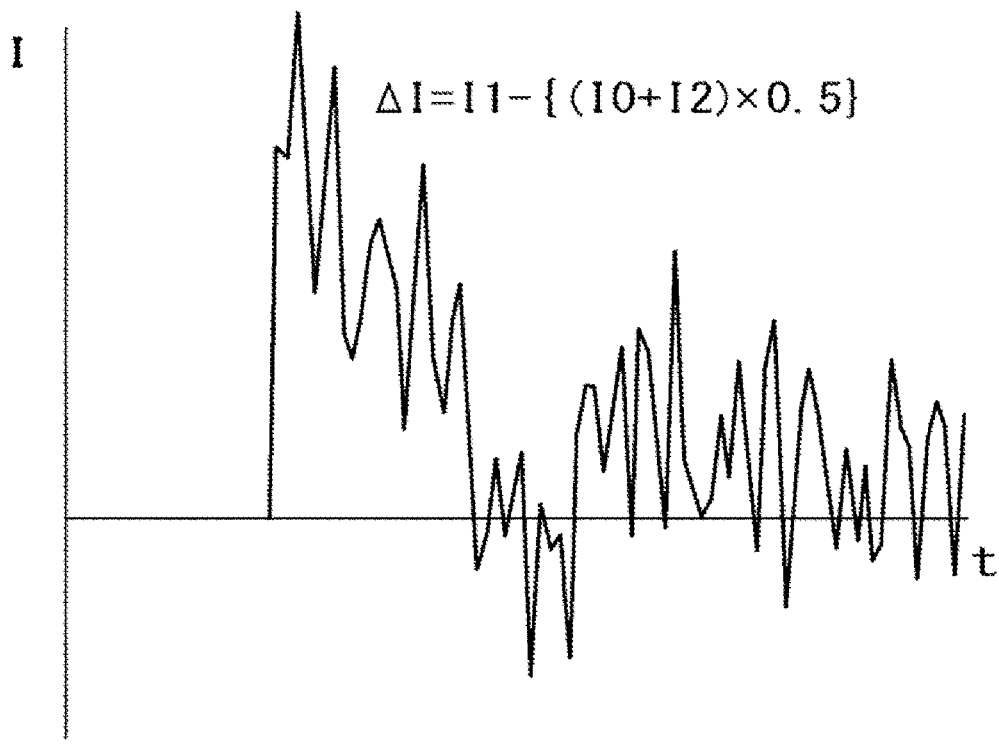
FIG. 16B

SEMICONDUCTOR DEVICE

CROSS-REFERENCE TO RELATED APPLICATIONS

The disclosure of Japanese Patent Application No. 2019-056603 filed on Mar. 25, 2019 including the specification, drawings and abstract is incorporated herein by reference in its entirety.

BACKGROUND

The present disclosure relates to semiconductor device and is applicable to a semiconductor device for controlling, for example, latching solenoids.

A solenoid valve (solenoid valve) is a type of electrically driven valve. It has a mechanism to open and close a valve (valve) by moving an iron piece called a plunger using the magnetic force of an electromagnet, and it is used for opening and closing control of a flow in a pipe through which fluid (hydraulic pressure, pneumatic pressure, water pressure, etc.) passes.

Although the solenoid refers to a coil in a narrow sense, in the engineering field, the movable iron core, a fixed core, often refers to an operating mechanism consisting of a coil, it refers to the operating mechanism specification. Latching solenoid is a self-holding type using a permanent magnet in the fixed core of the solenoid, since the holding using the attracting force of the permanent magnet is low power.

Latching solenoid type solenoid valve, for example, the valve is opened by the movable iron core is moved to the permanent magnet side, the valve is closed by the movable iron core is separated from the permanent magnet. Latching solenoid type solenoid valve, as shown in Patent Document 1, when the movable iron core is moved to the permanent magnet side, the end point detection is easy because the bottom appears due to a rapid change in the solenoid (coil) current.

There is disclosed technique listed below.
[Patent Document 1] Japanese Unexamined Patent Application Publication No. Sho 59(1984)-171803

SUMMARY

On the other hand, the solenoid valve of the latching solenoid type, when the movable iron core is away from the permanent magnet, the end point detection is not performed. Other objects and novel features will become apparent from the description of this disclosure and the accompanying drawings.

Outline of the typical ones among the present disclosure is briefly explained as follows. That is, the semiconductor device controls the first circuit for supplying/stopping the current supplied by a DC power supply to the latching solenoid consisting of a coil and a movable iron core and a permanent magnet, the current based on the input from the current detection circuit to measure. The semiconductor device includes a control circuit having a low power dissipation mode in which the leakage current is reduced, and a normal operation mode. The control circuit maintains the low power consumption mode when there is no current flowing through the coil, and maintains the normal operation mode when the current flowing through the coil, further, the movable iron core or the permanent magnet It comprises a control circuit configured to detect the inflection point of the current detected by the current detection circuit when leaving.

According to the above semiconductor device, it is possible to determine that the movable iron core of the latching solenoid is away from the permanent magnet.

BRIEF DESCRIPTION OF THE DRAWINGS

FIG. 1A and FIG. 1B are diagrams illustrating a configuration of a latching solenoid-type solenoid valve, FIG. 1A is a diagram showing a state in which the solenoid valve is closed, FIG. 1B is a diagram showing a state in which the solenoid valve is opened.

From FIG. 2A to FIG. 2G are diagrams illustrating a case where the induced magnetic field and the external magnetic field are parallel. FIG. 2A is a diagram illustrating a magnetic field of a coil, FIG. 2B is a diagram showing a change in the magnetic field when there is no movable iron core in the coil, FIG. 2C is a diagram showing a change in the coil current when there is no movable iron core in the coil, FIG. 2D is a diagram showing a change in the magnetic field when there is a movable iron core in the coil, FIG. 2E is a diagram showing a change in the coil current when there is a movable iron core in the coil.

From FIG. 3A to FIG. 3G are diagrams illustrating a case where the induced magnetic field and the external magnetic field is antiparallel. FIG. 3A is a diagram illustrating a magnetic field of the coil, FIG. 3B is a diagram showing a change in the magnetic field when there is no movable iron core in the coil, FIG. 3C is a diagram showing a change in the coil current when there is no movable iron core in the coil, FIG. 3D is a diagram showing a change in the magnetic field when there is a movable iron core in the coil, FIG. 3E is a diagram showing a change in the coil current when there is a movable iron core in the coil.

FIG. 11A and FIG. 11B are diagrams illustrating the end-point detection algorithm of FIG. 10A and FIG. 10B. FIG. 11A is a diagram showing a time change of the coil current, FIG. 11B is a diagram showing a time change of the coil current/time.

FIG. 13A is a diagram showing a time change of the coil current, FIG. 13B is a diagram showing a time change of $\Delta I$.

FIG. 15A and FIG. 15B are diagrams showing the characteristics of the coil current when the noise is small. FIG. 15A is a diagram showing a time change of the coil current, FIG. 15B is a diagram showing a time change of $\Delta I$.

FIG. 16A and FIG. 16B are diagrams showing the characteristics of the coil current when the noise is large. FIG. 16A is a diagram showing a time change of the coil current, FIG. 16B is a diagram showing a time change of ΔI.

DETAILED DESCRIPTION

Figure 4:
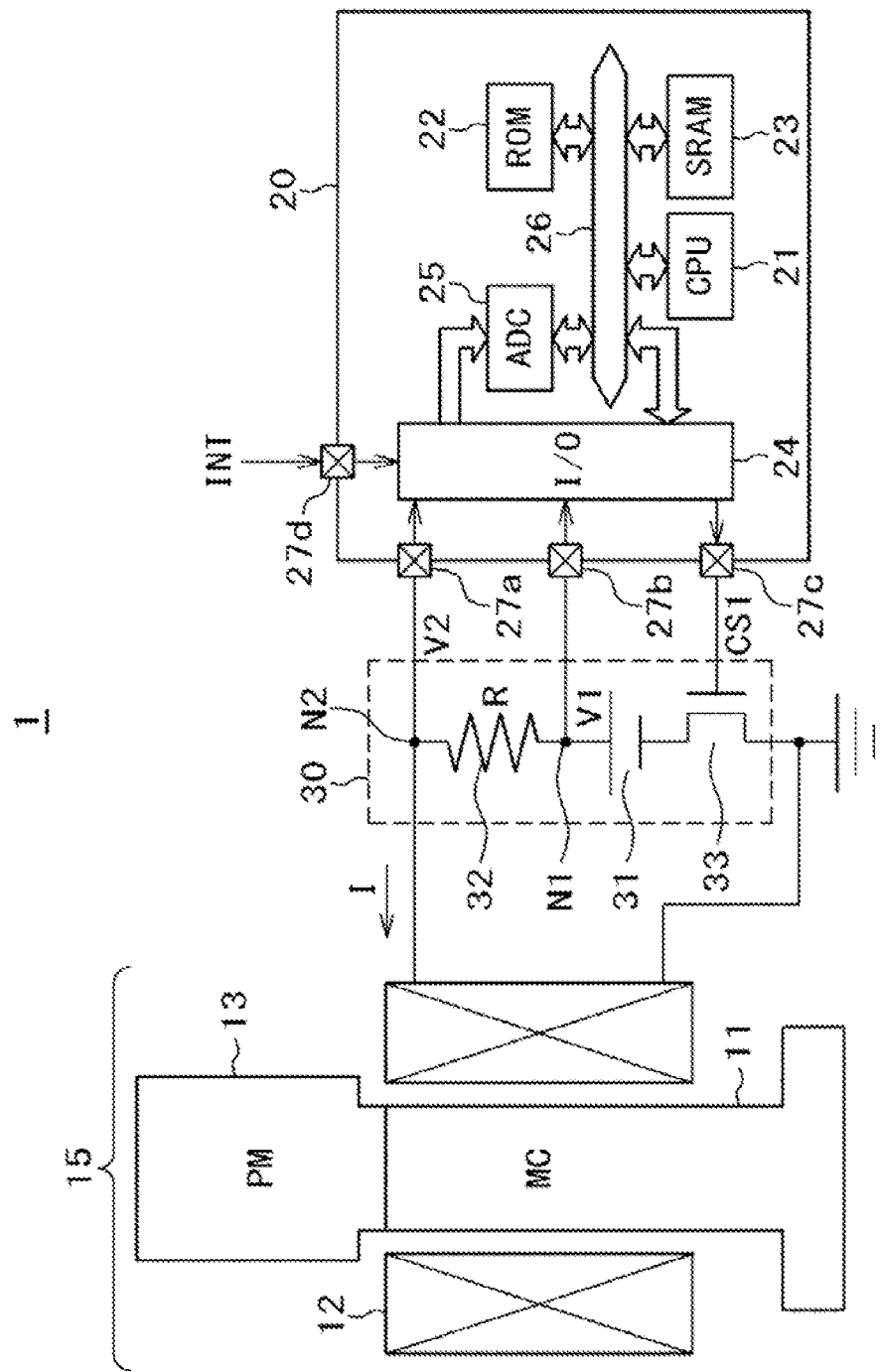
FIG. 4 is a diagram showing a configuration of a control system of the latching solenoid of the embodiment.

Hereinafter, embodiments, the Embodiment and modified example will be described with reference to the drawings. However, in the following description, the same components may be omitted from repeated descriptions with the same reference numerals.

First, the solenoid valve of the latching solenoid will be described with reference to Figures. FIG. 1A and FIG. 1B are diagrams illustrating a configuration of a solenoid valve of the etching solenoid type, FIG. 1A is a diagram showing a state in which the solenoid valve is closed, FIG. 1B is a diagram showing a state in which the solenoid valve is opened.

Latching solenoid-shaped solenoid valve 10 includes a movable iron core (MC) 11 is a plunger, a coil 12, a latching solenoid 15 is an operation mechanism constituted by a permanent magnet (PM) 13 and a spring 14 is a fixed core, the valve portion 19 constituted by an orifice 18 is an opening of the valve 16 and the wall 17 integrally formed in the lower portion of the movable iron core 11. If the magnetic force (Fm) of the movable iron core 11 and the permanent magnet 13 by flowing a current to the coil 12 is smaller than the spring force (Fs) of the spring 14 is a force that attempts to separate the movable iron core 11 from the permanent magnet 13 (Fm<Fs), as shown in the FIG. 1A, the movable iron core 11 is away from the permanent magnet 13, the valve 16 closes the orifice 18, the solenoid valve is in a closed state (first state). If the magnetic force of the movable iron core 11 and the permanent magnet 13 by flowing a current to the coil 12 (Fm) is greater than the spring force of the spring 14 (Fs) (Fm>Fs), as shown in the FIG. 1B, the movable iron core 11 is adsorbed on the permanent magnet 13, the valve 16 away from the orifice 18, the solenoid valve is opened state (second state). The direction of the current flowing through the coil 12 in the case of transitioning from the second state to the first state, and the direction of the current flowing through the coil in the case of transitioning from the first state to the second state is opposite. As a valve, which is opened or closed depends on the hardware configuration of the orifice, valve, wall, etc. . . . . .

Here, the principle of the change of the coil current in the latching solenoid. First, when the induced magnetic field and the external magnetic field are parallel, i.e., the case where the solenoid valve of FIG. 1B transitions from the first state in which the solenoid valve of FIG. 1A is closed to the second state opened will be described with reference to FIG. 2A-2G are diagrams illustrating a case where the induced magnetic field and the external magnetic field are parallel.

FIG. 2A is a diagram illustrating a magnetic field of the coil, FIG. 2B is a diagram showing a change in the magnetic field when there is no movable iron core in the coil, FIG. 2C is a diagram showing a change in the coil current when there is no movable iron core in the coil. FIG. 2D is a diagram showing the distribution of the inductive magnetic field when the movable iron core is slightly protruding from the coil, FIG. 2E is a diagram showing the distribution of the induction magnetic field in the case of a movable iron core in the center of the coil, FIG. 2F is a diagram showing a change in the magnetic field in the case of a movable iron core in the coil, FIG. 2G is a diagram showing a change in the coil current in the case of a movable iron core in the coil.

The external magnetic field (E) is the magnetic field created by the permanent magnet, and the induced magnetic field (magnetic flux: LI) is the magnetic field created by the coil. Where L is the inductance of the coil and I is the current of the coil. The coil has the property of generating back electromotive force (V) in response to the sum of the magnetic fields penetrating therein, i.e., the temporal variation of the total electric flux (φ). In other words, dφ/dt+RI=V, is φ=LI+φ'.

In FIG. 2A, when the first switch (SW) is turned on, the current (I) begins to flow in the coil (COIL), the induced magnetic field is increased. This causes back electromotive force in the coil because it increases the electric flux completely through the coil. Therefore, the voltage shown in FIG. 2A is a DC power supply of V, in a series circuit in which the resistance value of R is composed of a coil of L, as shown in FIG. 2C, the current (I) does not suddenly increase to V/R, it gradually increases. After enough time, since the magnetic field stabilizes, the back electromotive force becomes zero and the current (I) stabilizes at V/R. This corresponds to the case where there is no iron core in the coil.

On the other hand, the latching solenoid has a movable iron core. Since Iron has high permeability and acts to concentrate the magnetic field, when the movable iron core (MC) is slightly protruding from the coil (COIL), the induction magnetic field as shown in FIG. 2D is distributed eccentrically to the movable iron core side. In this state, when increasing the current (I) of the coil in the same magnetic field direction as the permanent magnet, the magnetization of the movable iron core is intensified, at some time, the movable iron core is adsorbed on the permanent magnet. At this time, the movable iron core comes to the center side of the coil. As a result, the induced magnetic field becomes distributed around the center of the coil as shown in FIG. 2E, completely through the coil as shown in FIG. 2F electric flux (φ) increases. Therefore, for a moment, the back electromotive force of the coil increases, and the current (I) rapidly decreases as shown in FIG. 2G. Thereafter, the current (I) increases again toward V/R. As a result, a bottom occurs in the time variation of the current.

Next, when the induced magnetic field and the external magnetic field is antiparallel, i.e., the case where the solenoid valve of FIG. 1A from the second state in which the solenoid valve of FIG. 1B is opened changes to the closed first state will be described with reference to FIG. 3. From FIG. 3A to FIG. 3G are diagrams illustrating a case where the induced magnetic field and the external magnetic field are parallel, FIG. 3A is a diagram illustrating a magnetic field of the coil, FIG. 3B is a diagram showing a change in the magnetic field when there is a movable iron core in the coil, FIG. 3C is a diagram showing a change in the current of the coil when there is a movable iron core in the coil. FIG. 3D is a diagram showing the distribution of the inductive magnetic field when there is a movable iron core in the center of the coil, FIG. 3E is a diagram showing the distribution of the induction magnetic field when the movable iron core is slightly protruding from the coil, FIG. 3F is a diagram showing a change in the magnetic field when there is no movable iron core in the coil, FIG. 3G is a diagram showing a change in the current of the coil in the case there is no movable iron core in the coil.

In FIG. 3A, when the first switch (SW) is turned on, the current (I) begins to flow in the coil (COIL), the induced magnetic field is increased. Now, unlike from FIG. 2A to FIG. 2G, the induced magnetic field cancels the external magnetic field, so that the total electric flux (cp) through the coil decreases gradually, as shown in FIG. 3B. Incidentally, the time change of the total electric flux, i.e. when viewed in time derivative, since only the components of the induced magnetic field, similarly to from FIG. 2A to FIG. 2G, a back electromotive force occurs in the direction to suppress the increase of the current (I), as shown in FIG. 3C, the current (I) does not suddenly increase to V/R, it gradually increases. After enough time, since the magnetic field stabilizes, the back electromotive force becomes zero and the current (I) stabilizes at V/R. This is the case when there is no iron core in the coil.

On the other hand, the latching solenoid has a movable iron core. If the movable iron core (MC) is on the coil center side as shown in FIG. 3D, the induction magnetic field is distributed so as to penetrate the entire coil. In this state, when increasing the current (I) of the coil in the magnetic field direction opposite to the permanent magnet, the attracting force of the permanent magnet and the movable iron core is weakened, at some time, the repulsive force of the spring 14, the movable iron core is detached from the permanent magnet, some protrudes from the coil. As a result, the inductive magnetic field as shown in FIG. 3E also partially protrudes from the coil, the induction magnetic field penetrating the coil is reduced. However, as shown in FIG. 3F, the total electric flux through the coil is rather increased. This is because, as shown in FIG. 3G, the component that cancels the external magnetic field increase rate of the current (I) decreases (induced magnetic field) is reduced. As a result, the rate of increase of the current (I) increases, as shown in FIG. 3G, so as to reduce the time variation of the electric flux through the coil entirely, i.e., to enhance the reduced induction field. However, the change in the current (I) that increases after the increase rate of the current (I) decreases is difficult to understand, conventionally, was not conscious. The inventors have discovered changes in this current (I), and have clarified that the phenomenon can be explained by physical phenomena.

Figure 5:
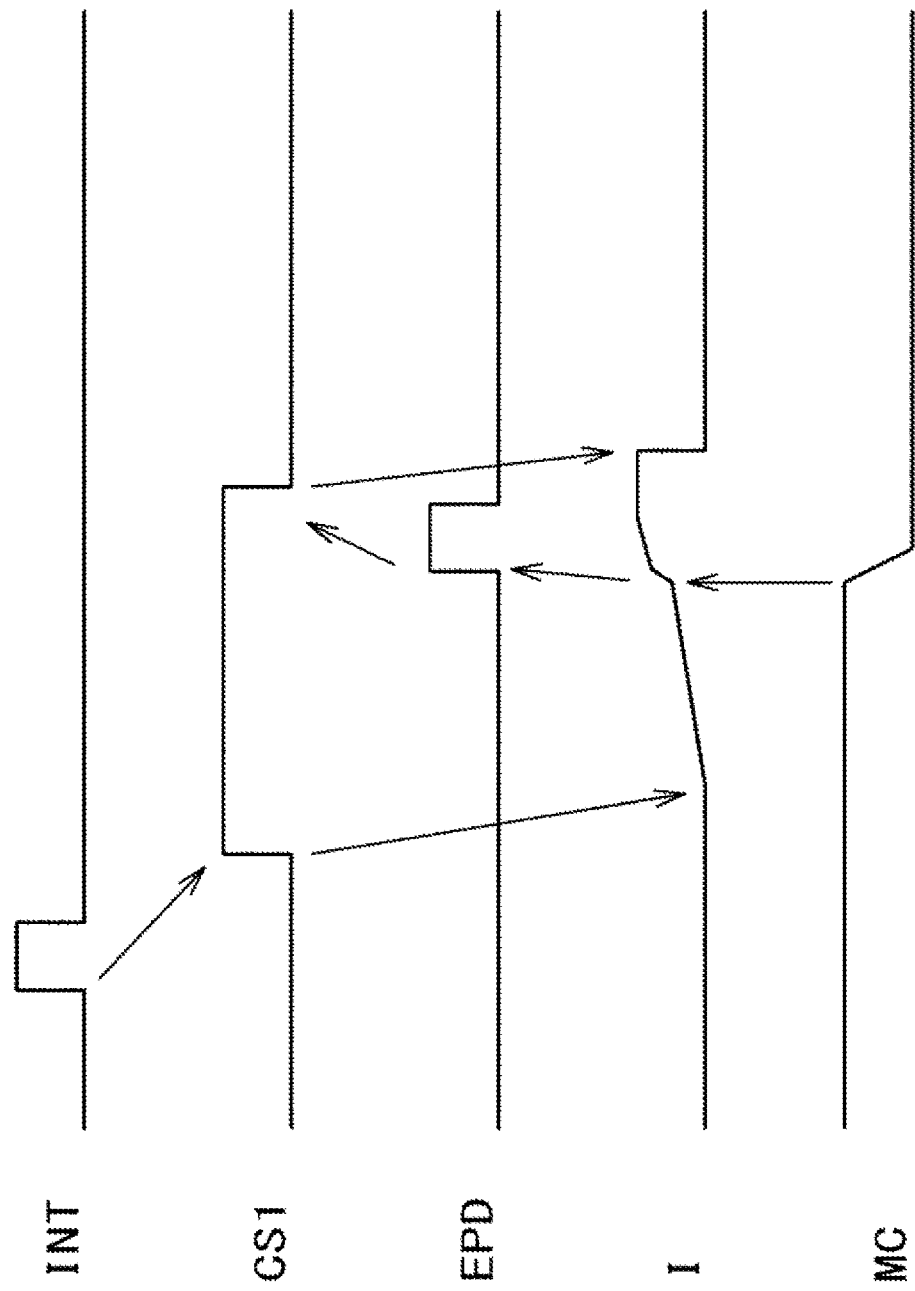
FIG. 5 is a timing diagram illustrating the operation of the control system of FIG. 4.

The control system of the latching solenoid of the embodiment will be described with reference to FIG. 4 and FIG. 5. FIG. 4 is a diagram showing a configuration of a control system of the latching solenoid of the embodiment. FIG. 5 is a timing diagram showing the operation of the control system of FIG. 4.

As shown in FIG. 4, the control system 1 includes a microcontroller 20 and the power supply circuit 30 is a latching solenoid 15 and a control circuit. The microcontroller 20 controls the latching solenoid 15 via a power supply circuit 30. Configuration of the latching solenoid 15 is similar to the latching solenoid 15 used in the solenoid valve 10 of FIG. 1A and FIG. 1B.

The microcontroller 20 includes a central processing device (CPU) 21, a memory (ROM) 22 for storing a software program or the like, and a memory (SRAM) 23 for temporarily storing data. Further, the microcontroller 20 includes an I/O port (I/O) 24 for inputting and outputting data to and from the outside, an A/D converter (ADC) 25 for converting the analog data into digital data, a bus 26 connected to the CPU21, the ROM22, the I/O24 and the CPU21, terminals 27a, 27b, 27c, and 27d.

Power supply circuit 30 includes a DC power source 31 and a resistor 32 and the current switch 33 constituted by a battery or the like. Resistor 32 is a current sensing circuit, and microcontroller 20 is electrically powered by resistor 32. The voltage drop (voltage between terminals 27a and 27b) is measured by ADC25, and the current is measured by converting the voltage to current. Current switch 33 is a first circuit constituted by, for example, an N-channel type MOS transistor or the like. Current from the power supply circuit 30 when the current switch 33 is turned on by the first control signal of the terminal 27c (CS1) is supplied to the coil 12, the supply of current from the power supply circuit 30 when the current switch 33 is turned off to the coil 12 is stopped.

As shown in FIG. 5, the microcontroller 20, for example, when the interrupt signal (INT) input to the terminal 27d is asserted (activated), the CPU21 starts operation triggered thereby.

Next, the CPU21 turns High the first control signal (CS1) to turn on the current switch 33. Then, a voltage is applied in series to the coil 12, a current (I) begins to flow in the coil 12. Since the coil 12 generates back electromotive force by the inductance components, the current (I) does not increase suddenly, gradually increases. Part of the magnetic field coil 12 is formed is also formed in the movable iron core 11, to magnetize the movable iron core 11.

Now, when the magnetic force of the movable iron core 11 is increased, the attracting force between the permanent magnet 13 is weakened. Then, when the attracting force of the permanent magnet 13 and the movable iron core 11 is smaller than the repulsive force of the movable iron core 11, the movable iron core 11 is away from the permanent magnet 13. At this time, the total electric flux through the coil 12, i.e. the sum of the induced magnetic field produced by the external magnetic field and the coil 12 itself of the permanent magnet 13 is rather increased. This is because a part of the induction magnetic field to cancel the external magnetic field will protrude from the coil 12 by the movement of the movable iron core 11. As a result, the current (I) flowing through the coil 12 is increased in an attempt to reduce this change.

The microcontroller 20 monitors the current (I) flowing through the coil 12 in real time. Although there are a plurality of monitoring methods, here, the potential difference (V1−V2=voltage) between the node N1 and the node N2 with a series circuit including the coil 12 is detected by a ADC25, and it is converted into a current. The CPU21 calculates the current values by numerical processing programs stored in the ROM22. The arithmetic includes four-rule arithmetic and differential processing. CPU21, by this arithmetic process, detects the inflection point of the current (I) flowing through the coil 12, it is determined that the movable iron core 11 has moved (end point detection). Incidentally, the movable iron core in FIG. 5 (MC) 11 High a state of being adsorbed on the permanent magnet (PM) 13, the movable iron core (MC) 11 represents a state away from the permanent magnet (PM) 13 as Low. The inflection point here is a point where the rate of increase of the current (I) flowing through the coil 12 increases rapidly. Mathematically, it is the point where the current becomes zero when differentiated twice in time. The microcontroller 20 has variable parameters in the SRAM23. The variable parameter has the function of adjusting the judgment criterion by the program processing.

CPU21, after generating the end point detection signal (EPD) when the end point detection, turns off the current switch 33 by the first control signal (CS1) low. Thus, the coil 12 and the DC power supply 31 is separated, the current consumption from the DC power supply 31 is stopped.

After the current switch 33 is turned off, the coil 12 acts like a battery due to the back electromotive force of the residual inductive field. The energy of the residual induced magnetic field is gradually emitted as a leakage current in the circuit.

Figure 6:
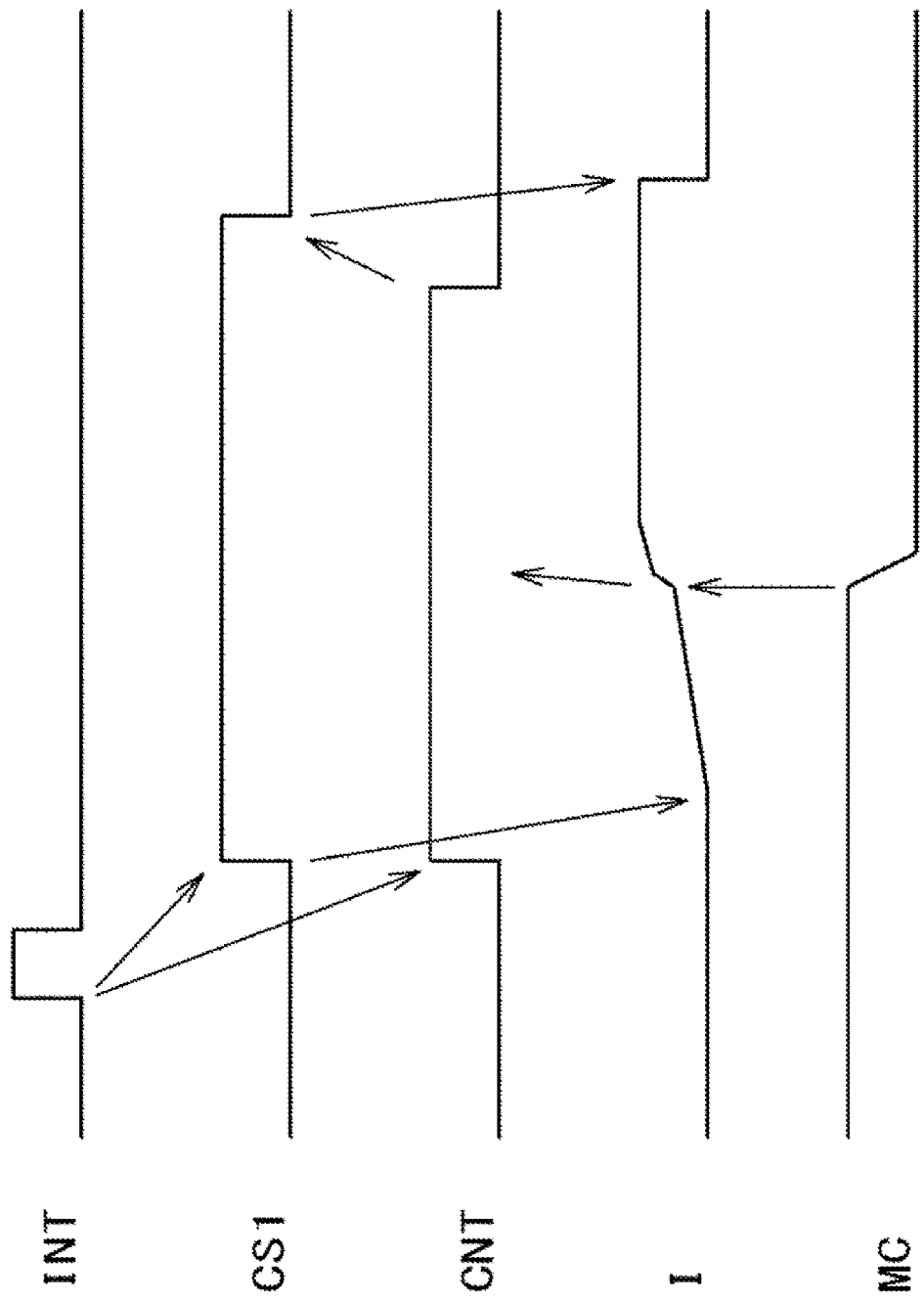
FIG. 6 is a timing diagram showing the operation of the control system of the comparative example.

It will be described with reference to FIG. 6 for the case of not performing the end point detection as in the present embodiment (Comparative Example). FIG. 6 is a timing diagram showing the operation of the control system of the comparative example.

Since the control system of the comparative example does not perform the end point detection, for example, to measure the time of flowing a current to the coil 12 by a counter incorporated in the microcontroller, the current switch 33 after a predetermined time to turn off. In order to complete the movement reliably movable iron core 11 is moved away from the permanent magnet 13, it is necessary to set a longer time. Therefore, excess current flows through the coil 12. They dissipate as the Joule heat of the resistor, resulting in purely wasteful power consumption.

Therefore, the embodiment, by detecting the inflection point of the current when the movable iron core 11 is away from the permanent magnet 13, it is possible to end point detection, thereby it is possible to reduce the current energized to the coil 12.

Figure 7:
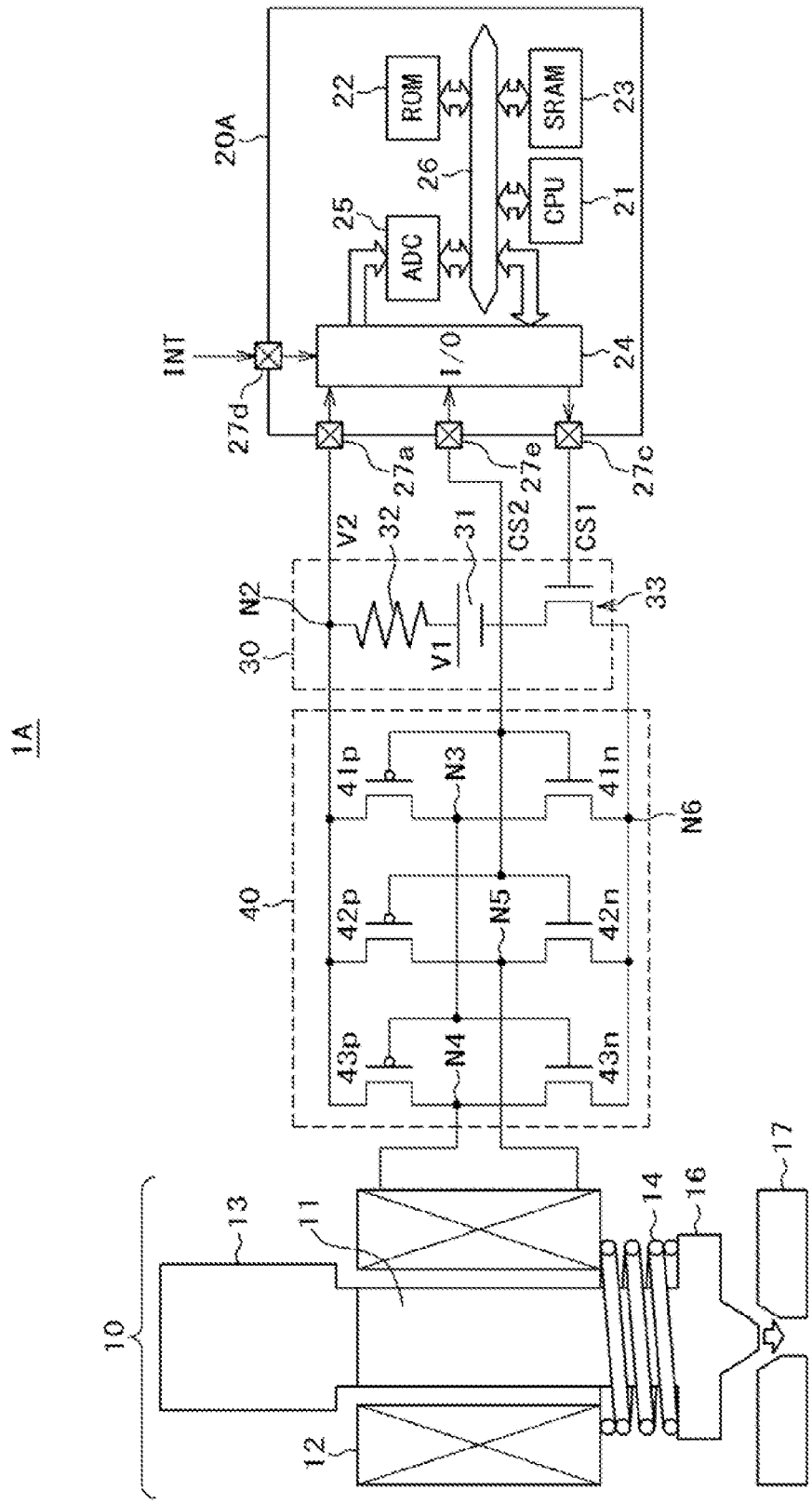
FIG. 7 is a diagram showing a configuration of a control system of the solenoid valve of the latching solenoid type of the Embodiment.
Figure 8:
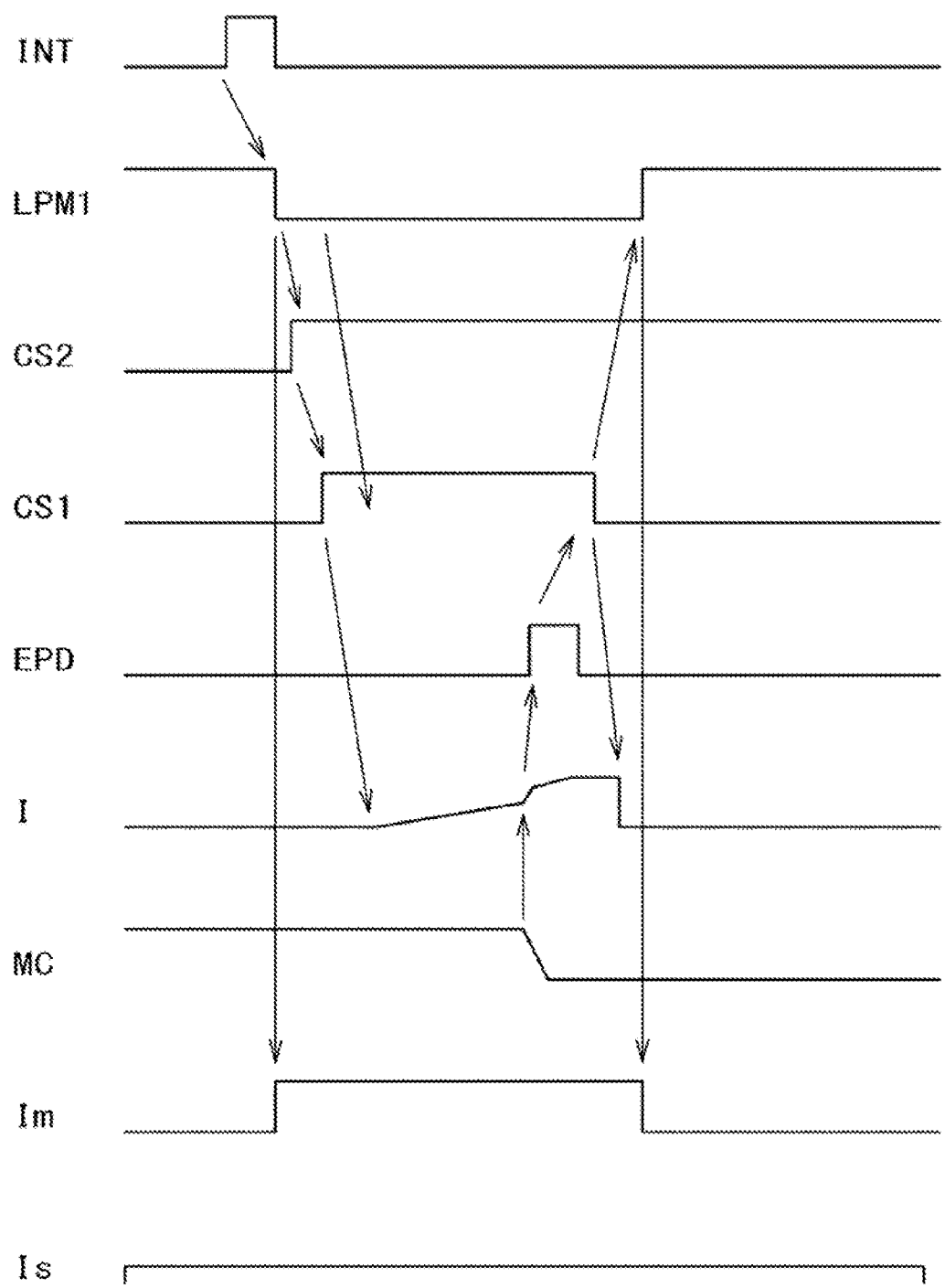
FIG. 8 is a timing diagram illustrating the operation of the control system of FIG. 7.
Figure 9:
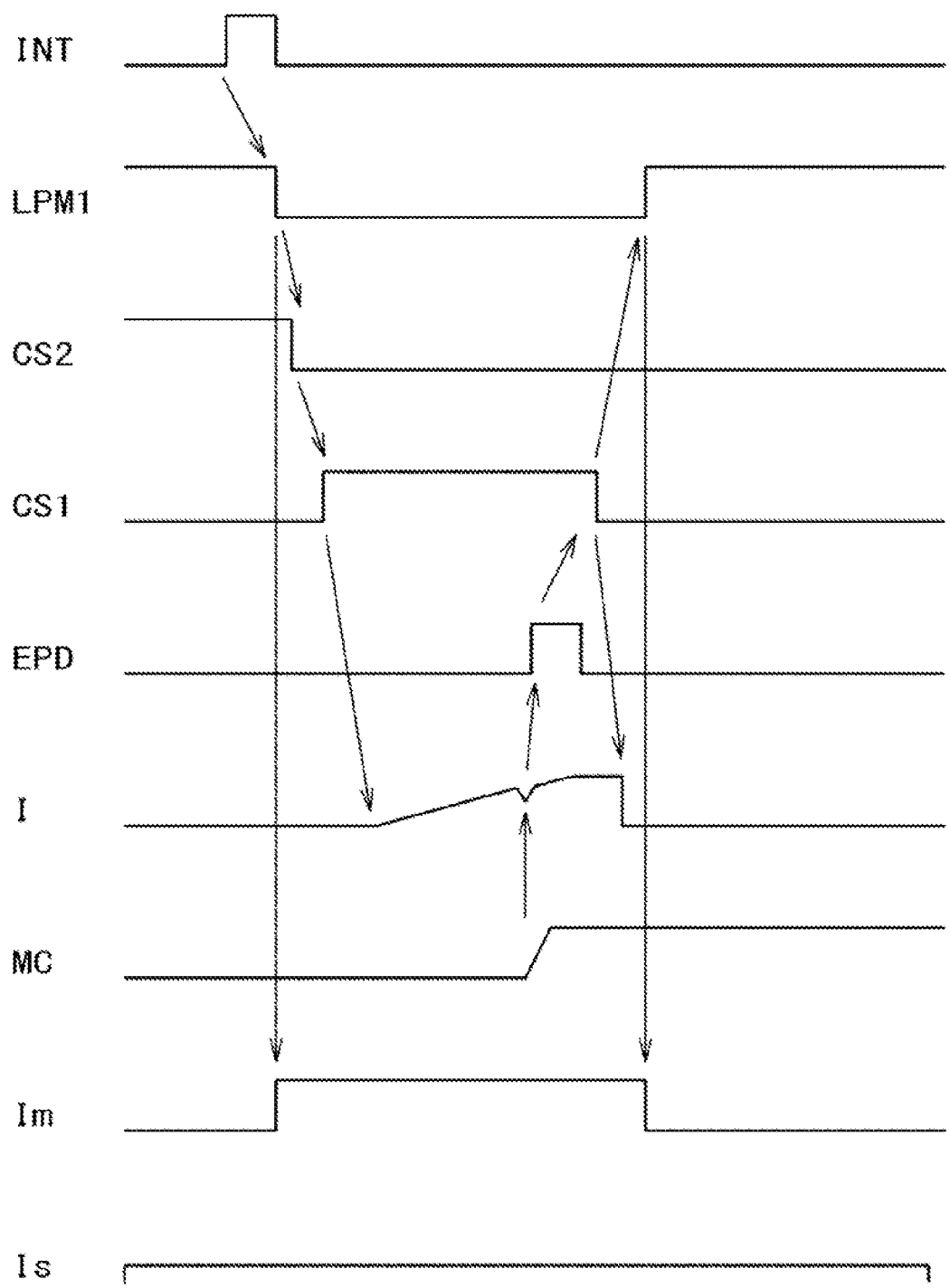
FIG. 9 is a timing diagram illustrating the operation of the control system of FIG. 7.

The control systems of the Embodiment latching solenoid-type solenoid valve will be described with reference to from FIG. 7 to FIG. 9. FIG. 7 is a diagram showing a configuration of a control system of the solenoid valve of the latching solenoid type of the Embodiment. FIG. 8 is a timing diagram showing the operation of the control system of FIG. 9 is a timing diagram showing the operation of the control system of FIG. 7.

As shown in FIG. 7, the control system 1A includes a solenoid valve 10, a microcontroller 20A, a power supply circuit 30, and a current direction switching circuit 40. The microcontroller 20A controls the solenoid valve 10 via the power supply circuit 30 and the current direction switching circuit 40. Configuration of the solenoid valve 10 is the same as FIG. 1A and FIG. 1B.

The microcontroller 20A includes a central processing device (CPU) 21, a memory (ROM) 22 for storing a software program or the like, and a memory (SRAM) 23 for temporarily storing data or the like. The microcontroller 20A also has an I/O port (I/O) 24 that inputs and outputs data to and from an external device, an A/D converter (ADC) 25 that converts analog data into digital data, a ROM22, a CPU21, a bus 26 connected to the SRAM23, I/O24 and the ADC25, terminals 27a, 27c, 27d, and 27e. A ROM22 and a CPU21 and a A/D converter (ADC) 25, a bus 26 connected to the SRAM23 and the I/O24 and the ADC25, terminals 27a, 27c, 27d, and 27e, comprising. The microcontroller 20A consists of one semiconductor chip. The memory (ROM) 22 is composed of a non-volatile memory such as a flash memory, and the memory (SRAM) 23 is composed of a volatile memory such as a SRAM.

Power supply circuit 30 includes a DC power source 31 and a resistor 32 and the current switch 33 constituted by a battery or the like. Resistor 32 is a current sensing circuit, the microcontroller 20 measures the voltage drop due to the resistor 32 (the voltage of the terminal 27a) by the ADC25, the current by converting the voltage to a current. Current switch 33 is a first circuit constituted by, for example, an N-channel type MOSFET or the like. Current from the power supply circuit 30 when the current switch 33 is turned on by the first control signal of the terminal 27c (CS1) is supplied to the coil 12, the supply of current from the power supply circuit 30 when the current switch 33 is turned off to the coil 12 is stopped.

Current-direction switching circuit 40 is, for example, P-channel type MOSFET41p, 42p, 43p and N-channel type MOSFET41n, 42n, a second circuit composed of 43n. Node N3 is turned Low P channel type MOSFET43p by the second control signal (CS2) of the terminal 27e is turned High, the N channel type MOSFET42n is turned on, the node N2 of the power supply circuit 30, the node N4, the coil 12, the node N5, the series circuit of the node N6, the current flows in the direction of the node N5 from the node N4 to the coil 12. Node N3 is turned High P channel type MOEFET42p by the second control signal (CS2) of the terminal 27e becomes Low is turned on, the N-channel type MOSFET43n is turned on, the node N2 of the power supply circuit 30, the node N5, the coil 12, the node N4, the series circuit of the node N6, the current flows in the direction of the node N4 from the node N5 to the coil 12.

Next, the case where the movable iron core 11 of the operation of the control system 1A is separated from the permanent magnet 13.

As shown in FIG. 8, the microcontroller 20A is in the state of the first low-power mode (LPM1) in which the CPU21 clocks are stopped in the standby state. In this state, the microcontroller 20A, for example, an external switch or an infrared sensor input by hand, by a command in the radio, when the interrupt signal (INT) input to the terminal 27d is asserted, the clock operates as a trigger it becomes a normal operation mode capable of performing high-speed processing, the CPU21 starts operation.

Next, the CPU21 sets the current direction switching circuit 40 in a direction such that the magnetic field of the magnetic field and the permanent magnet 13 of the coil 12 is antiparallel. In case of FIG. 7, by setting the second control signal (CS2) to High, so that the flow of current (I) from the upper (node N4) toward the coil 12. Here, in this direction, the magnetic field of the magnetic field and the permanent magnet 13 of the coil 12 is defined to be antiparallel. Incidentally, by setting the second control signal (CS2) to Low, so that the flow of current (I) from the lower side (node N5) toward the coil 12. Next, the CPU21 turns High the first control signal (CS1) to turn on the current switch 33. Then, a voltage is applied in series with the coil 12, a current (I) begins to flow in the coil 12. Since the coil 12 generates back electromotive force by the inductance components, the current (I) does not increase suddenly, gradually increases. Part of the magnetic field coil 12 is formed is also formed in the movable iron core 11, to magnetize the movable iron core 11.

Now, when the magnetic force of the movable iron core 11 is increased, the attracting force between the permanent magnet 13 is weakened. Then, when the attracting force of the permanent magnet 13 and the movable iron core 11 is smaller than the repulsive force of the spring 14, the movable iron core 11 is away from the permanent magnet 13, the valve 18 of the lower end of the movable iron core 11 is pressed against the opening 18 and the wall 17 facing by the force of the spring 14, the movable iron core 11 is stationary. At this time, the total electric flux through the coil 12, i.e. the sum of the induced magnetic field formed by the external magnetic field and the coil 12 itself of the permanent magnet 13 is rather increased. This is because a part of the induction magnetic field to cancel the external magnetic field will protrude from the coil 12 by the movement of the movable iron core 11. As a result, the current (I) flowing through the coil 12 is increased in an attempt to reduce this change.

The microcontroller 20A monitors the current (I) flowing through the coil 12 in real time. Here, the voltage (V2) of a node N2 with a series circuit including the coil 12 is detected by a ADC25, and it is converted into a current. The CPU21 calculates the current values using numerical processing programs. The arithmetic includes four-rule arithmetic and differential processing. CPU21, by this operation process, detects the inflection point of the current (I) flowing through the coil 12, it is determined that the movable iron core 11 has moved (end point detection). Incidentally, the movable iron core (MC) 11 in FIG. 8 High a state of being adsorbed on the permanent magnet (PM) 13, the movable iron core (MC) 11 represents a state away from the permanent magnet (PM) 13 as Low. These pluralities of variable parameters have the function of adjusting the criterion by the program processing. In the initial state, numerical processing programs and variable parameters are stored in the ROM22, but they are stored in the SRAM23 at the time of execution.

After the CPU21 generates the end point detection signal (EPD) when the end point detection, the first control signal (CS1) is turned low to turn off the current switch 33. Thus, the coil 12 and the DC power supply 31 is separated, the current consumption from the DC power supply 31 is stopped. The CPU21 clocks are then stopped to place the microcontroller 20A in a low power mode. By this, it is possible to reduce the power consumption of the microcontroller 20A.

After the current switch 33 is turned off, the coil 12 acts like a battery due to the back electromotive force of the residual inductive field. The energy of the residual induced magnetic field is gradually emitted as a leakage current in the circuit. If this effect is of concern, a separate discharge circuit may be provided to control the discharge from the microcontroller 20A.

Next, a description will be given of a case where the movable iron core 11 of the operation of the control system 1A is adsorbed on the permanent magnet 13.

As shown in FIG. 9, the microcontroller 20A is in the state of the first low-power mode (LPM1) in which the CPU21 clocks are stopped in the standby state. In this state, the microcontroller 20A, for example, an external switch or an infrared sensor input by hand, by a command in the radio, when the interrupt signal (INT) input to the terminal 27d is asserted, the clock operates as a trigger it becomes a normal operation mode capable of performing high-speed processing, the CPU21 starts operation.

Next, the CPU21 sets the current direction switching circuit 40 in a direction such that the magnetic field of the magnetic field and the permanent magnet 13 of the coil 12 is parallel. In case of FIG. 7, if the second control signal (CS2) is set to Low, so that the flow of current (I) from the lower side (node N5) toward the coil 12. Here, in case of this direction, the magnetic field of the magnetic field and the permanent magnet 13 of the coil 12 is defined to be parallel. Next, the CPU21 turns High the first control signal (CS1) to turn on the current switch 33. Then, a voltage is applied in series to the coil 12, the current (I) begins to flow to the coil 12. Since the coil 12 generates back electromotive force by the inductance components, the current (I) does not increase suddenly, gradually increases. Part of the magnetic field coil 12 is formed is also formed in the movable iron core 11, to magnetize the movable iron core 11.

Now, when the magnetic force of the movable iron core 11 is increased, the attracting force between the permanent magnet 13 is increased. Then, when the attracting force of the permanent magnet 13 and the movable iron core 11 is greater than the repulsive force of the spring 14, the movable iron core 11 is adsorbed on the permanent magnet 13, the valve 16 of the lower end of the movable iron core 11 is opposed away from the orifice 18 and the wall 17, the movable iron core 11 is stationary. At this time, the movable iron core 11 comes to the center side of the coil 12. As a result, the induced magnetic field becomes distributed around the central of the coil 12, the total electric flux (cp) through the coil 12 is increased. Therefore, for a moment, the back electromotive force of the coils increases and the current (I) decreases rapidly. Thereafter, the current (I) increases again. As a result, a bottom occurs in the time variation of the current.

The microcontroller 20A monitors the current (I) flowing through the coil 12 in real time. Here, the voltage (V2) of a node N2 with a series circuit including the coil 12 is detected by a ADC25, and it is converted into a current. The CPU21 calculates the current values using numerical processing programs. The arithmetic includes four-rule arithmetic and differential processing. CPU21, by this operation process, detects the inflection point of the current (I) flowing through the coil 12, it is determined that the movable iron core 11 has moved (end point detection). Incidentally, the movable iron core in FIG. 9 (MC) 11 High a state of being adsorbed on the permanent magnet (PM) 13, the movable iron core (MC) 11 represents a state away from the permanent magnet (PM) 13 as Low. Multiple variable parameters are used to adjust the criterion for program processing.

After the CPU21 generates the end point detection signal (EPD) when the end point detection, the first control signal (CS1) is turned low to turn off the current switch 33. Thus, the coil 12 and the DC power supply 31 is separated, the current consumption from the DC power supply 31 is stopped. The CPU21 clock is then stopped to place the microcontroller 20A in the first low-power mode (LPM1). This makes it possible to reduce the power consumption of the microcontroller 20A.

Figure 10A:
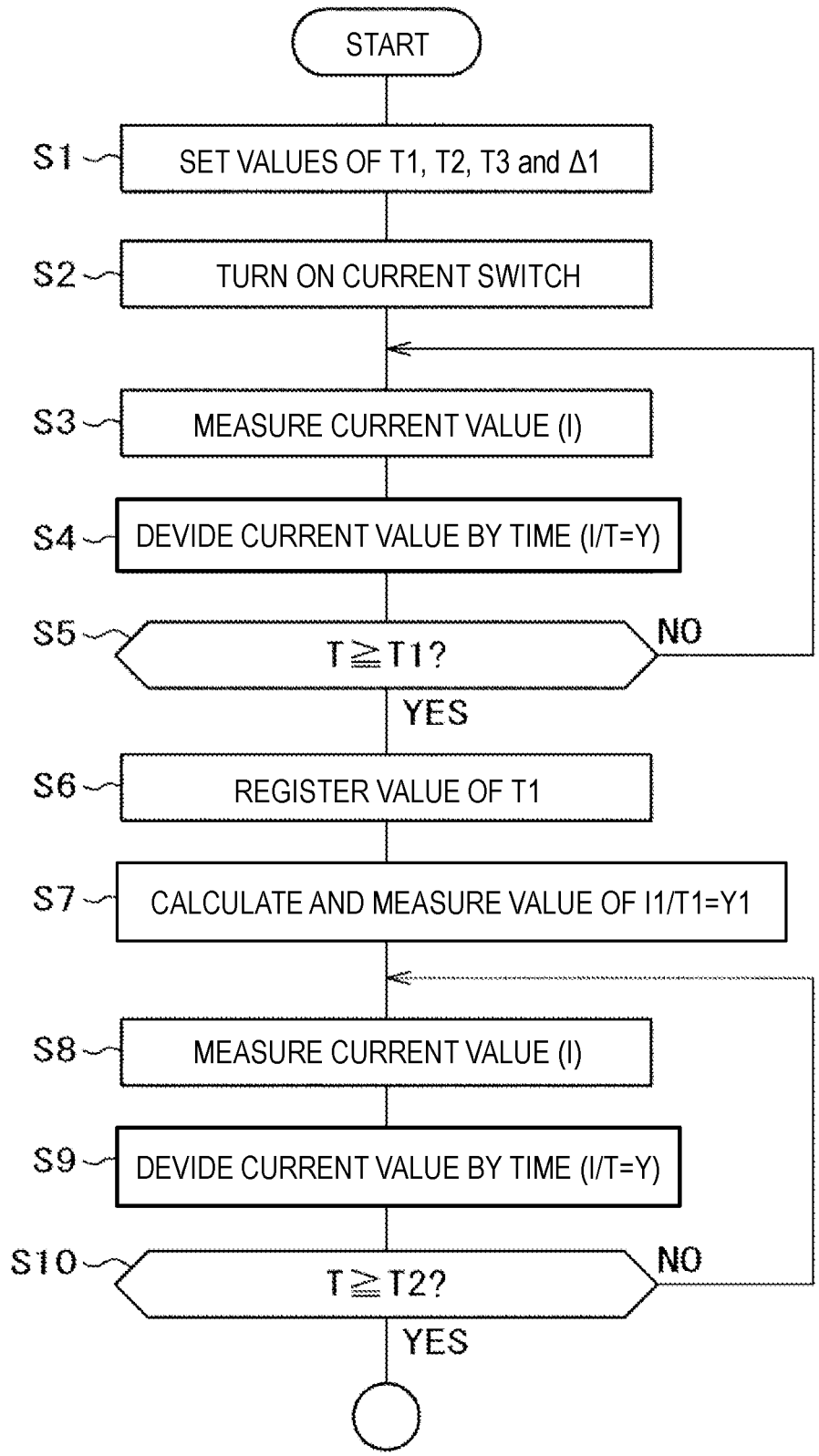
FIG. 10A is a flowchart illustrating algorithms for endpoint detection of a Embodiment.
Figure 10B:
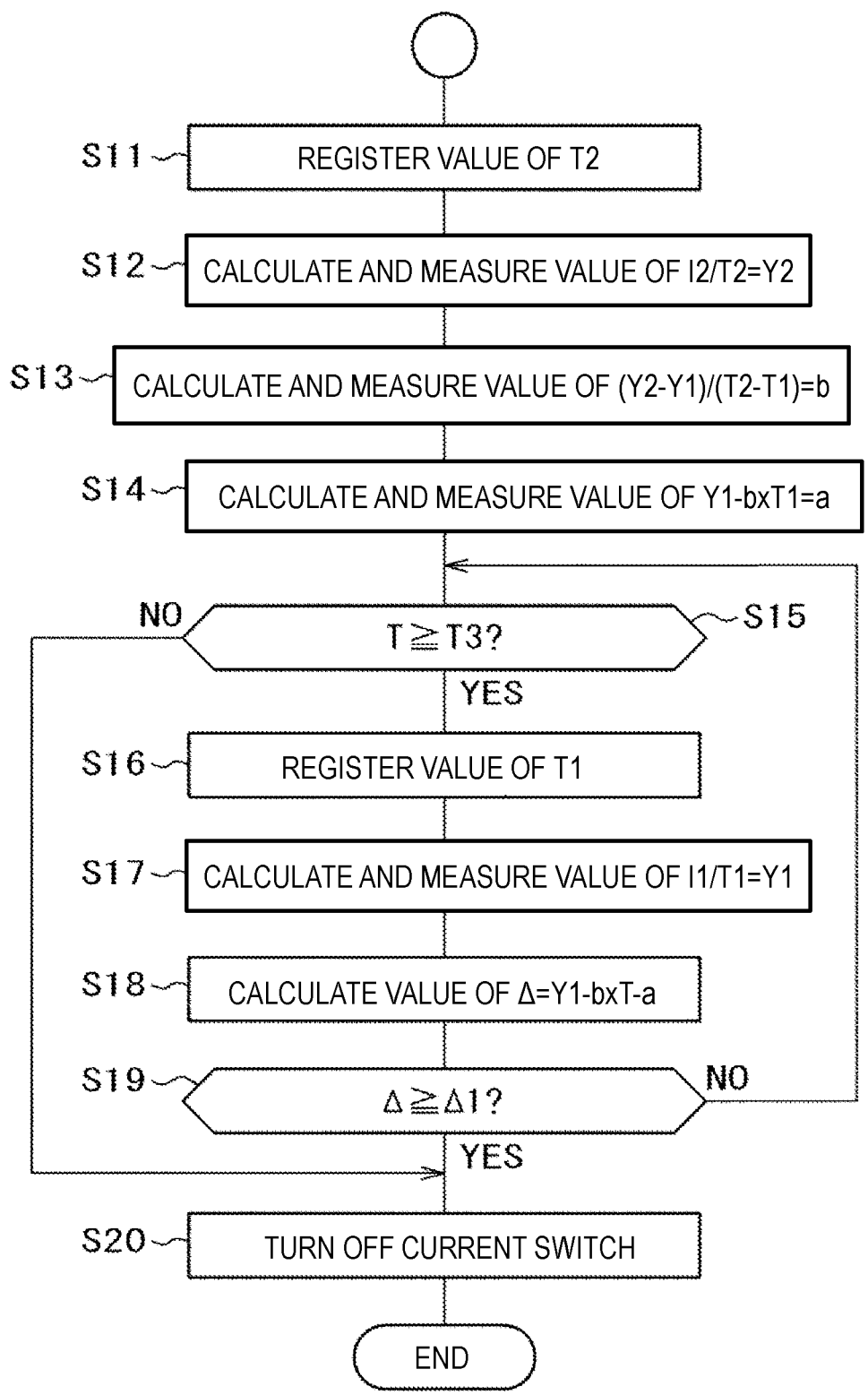
FIG. 10B is a flow chart describing the algorithms for detecting the end point of the Embodiment.

Next, FIG. 10A and FIG. 10B will be described with reference to 11 for an example of an algorithm of end point detection when the movable iron core 11 is away from the permanent magnet 13. FIG. 10A and FIG. 10B are flowcharts illustrating algorithms for end-point detection of the Embodiment. FIG. 11A and FIG. 11B are diagrams illustrating an endpoint detection algorithm of FIG. 10A and FIG. 10B. FIG. 11A is a diagram illustrating a time variation of the current of the coil and FIG. 11B is a diagram showing a time change of the current/time of the coil. Numerical processing programs of the Embodiment include a process of dividing the detected current by the time since the current begins to flow.

First, as shown in FIG. 11A, until the movable iron core 11 is moved, the time change of the current (I) flowing through the coil 12 increases in proportion to the formula of $1-\exp(-T/T0)$. Here is $T0=L/R$, L is the inductance of the coil 12, R is the resistance value of the resistor 32. When this formula is expanded in series and left up to the second term, it is $1-\exp(-T/T0) \approx T/T0 - 0.5 (T/T0)2$. That is, the current (Ic) flowing through the coil 12, for a while after turning on the current switch33, it can be approximated to $I \approx \alpha T - \beta T2$.

Therefore, when "the detected current is divided by the time since the current starts to flow", it is $Y=I/T \fallingdotseq \alpha-\beta T$.

On the other hand, when the movable iron core 11 is moved, the current flowing through the coil 12 (I) will deviate from the formula of 1-exp(-T/T0). That is, as shown in FIG. 11B, the value obtained by "dividing the detected current by the time since the current starts to flow" will deviate suddenly from the approximate expression of $\alpha-\beta T$. Here, the broken line in FIG. 11B points A before the movable iron core 11 is moved, a straight line passing through the B, it represents the alpha-$\beta T$. According to this, the detected current, the value obtained by dividing by the time from the start of the current flows, from the time when the movable iron core 11 occurs an inflection point in the current (I) of the coil 12 moves, alpha-beta T it can be seen that begins to deviate greatly from the straight line. This deviation amount ($\Delta$) is, the time exceeding a certain value, it can be seen that the time a little elapsed from the time when the movable iron core 11 has moved.

Using this principle, an algorithm for endpoint detection is shown in the flowchart of FIG. 10A and FIG. 10B.

First, the CPU21 sets the values of the parameters (T1, T2, T3, $\Delta$1) (step S1). In this algorithm, the maximum time (T3) is set in consideration of the possibility that the end point detection does not occur. The zero time set parameters, T1, T2, T3, and $\Delta$1, are treated as variable parameters. These values are set and stored in the ROM22 after the characteristics of the given latching solenoids 15 are investigated in advance. Further, with respect to T1, T2, learning the time of the end point detection, at any time, may be rewritten to the optimum value. Further, when there is noise in the measured current value and the end point detection is not performed correctly, the moving average processing may be added to the algorithm.

Next, the CPU21 turns on the current switch 33 by turning High the first control signal (CS1) (step S2), and measures the current value (I) (step S3).

Next, CPU21 divides the measured current value (I) by time (T) (Y=I/T) (step S4). CPU21 determines whether the time (T) has reached T1 (T≥T1) (step S5), if NO returns to step S3, if YES the process proceeds to step S6, the value of T1 in the CPU21 register (not shown) or SRAM23 (referred to as memories, etc.). Next, the CPU21 calculates the measured current (I1) at the time of T1 divided by the time (T1), that is, Y1=I1/T1, and stores it in a memory or the like (step S7).

Next, the CPU21 measures the current value (I) (step S8), the measured current value (I) divided by the time (T) (Y=I/T) (step S9). CPU21 determines whether the time (T) has reached T2 (T≥T2) (step S10), in the case of NO returns to step S8, in the case of YES the process proceeds to step S11 of FIG. 10B, and stores the value of T2 in the memory or the like.

Next, the CPU21 calculates the measured current (I2) at the time of T2 divided by the time (T2), i.e., Y2=I2/T2, stored in a memory or the like (step S12).

Next, using T1, T2, Y1, and Y2 stored in the memory or the like, the CPU21 calculates the value of b=(Y2-Y1)/(T2-T1) and stores it in the memory or the like (step S13). Here, b is the slope of the line through the two points A, B in FIG. 11B, corresponding to the $\beta$ of "$\alpha-\beta T$" described above.

Next, the CPU21 calculates the values of a=Y1-b×T1 using T1, Y1, and b stored in the memory or the like, and stores them in the memory or the like (step S14). Here, a is a point where the straight line passing through the two points A, B in FIG. 11B intersects the vertical axis (I/t).

Next, CPU21 determines whether the time (T) has reached the maximum time (T3) (T≤T3) (step S15), the process proceeds to step S20 in the case of NO, the process proceeds to step S16 in the case of YES. In step S16, the CPU21 measures the current value (I), the measured current value (I) divided by the time (T) (Y=I/T) (step S17).

Next, the CPU21 calculates the value of $\Delta$=Y-b×T-a using a, b stored in the memory or the like (step S18), whether or not $\Delta$ reaches $\Delta$1 ($\Delta \geq \Delta$1) is determined (step S19), in the case of NO returns to step S15, in the case of YES the process proceeds to step S20.

Finally, the CPU21 turns off the current switch 33 by the first control signal (CS1) low (step S20).

The present algorithm can also be applied to the algorithm of endpoint detection when the movable iron core 11 is adsorbed on the permanent magnet 13.

Though the detection of inflection point is possible in principle by using the advanced mathematical technique, this algorithm utilizes the physical property of the current flowing in the coil, and carries out the endpoint detection by the simple operation. Thus, it is possible to reduce the power consumption of the memory and CPU necessary for the operation.

By detecting the inflection point of the current when the movable iron core 11 is away from the permanent magnet 13, it is possible to end point detection, it is possible to reduce the current energized to the coil 12. It is possible to turn off the current switch 33 even if the inflection point detection (end point detection) was not possible within a predetermined time.

Modified Example

Hereinafter, some exemplary modified examples of the Embodiment are exemplified. In the following modified example description, it is assumed that the same reference numerals as those in the above Embodiment may be used for parts having the same configuration and function as those described in the above Embodiment. Then, with regard to the description of such a portion, it is assumed that the description in the above-described Embodiment may be appropriately incorporated to the extent that it is technically consistent. Also, parts of the above-described Embodiment, and portions or portions of the plurality of modified example, as appropriate, can be applied in a composite manner to the extent that is technically consistent.

First Modified Example

Figure 12:
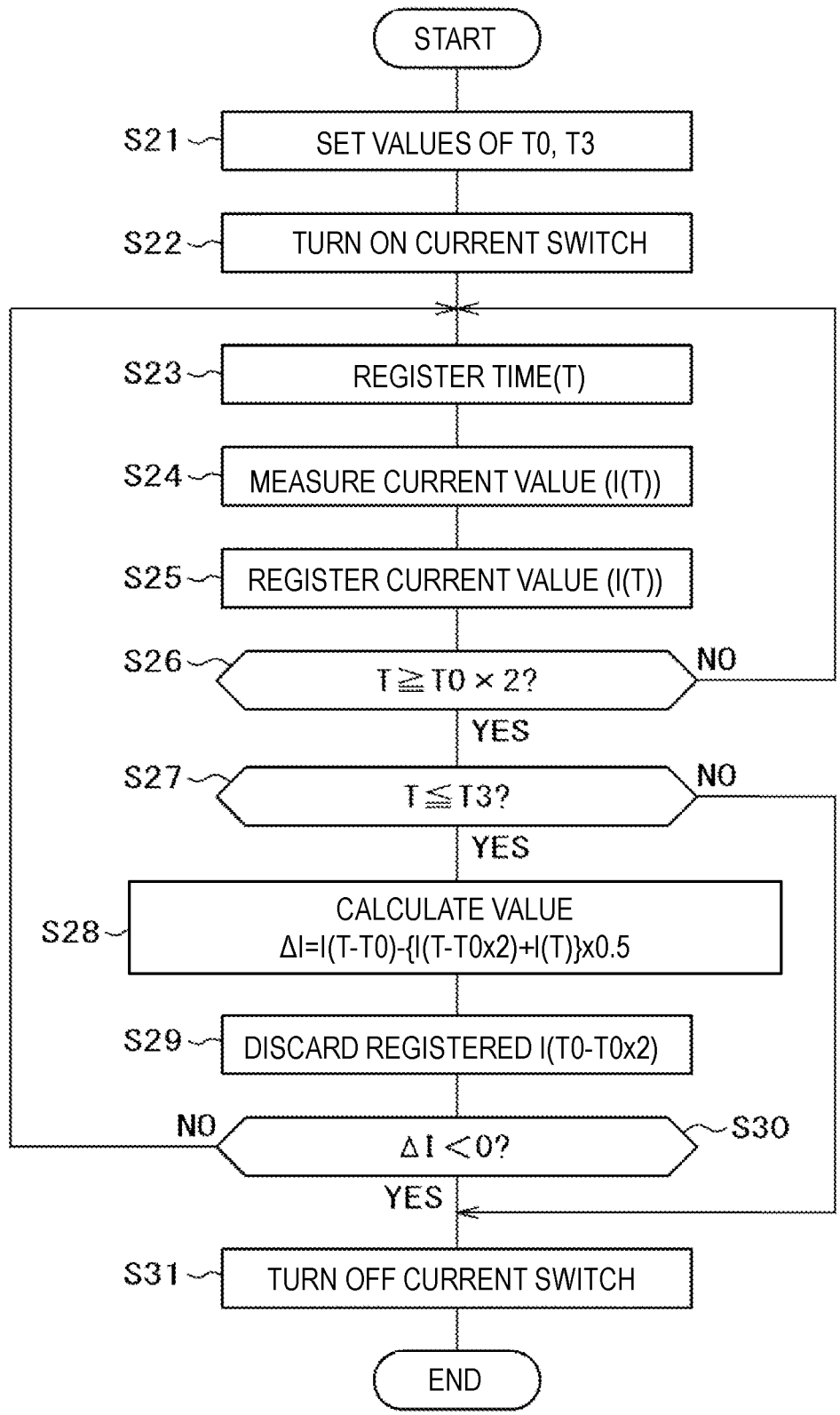
FIG. 12 is a flowchart illustrating algorithms for end-point detection of the first modified example.
Figure 13A:
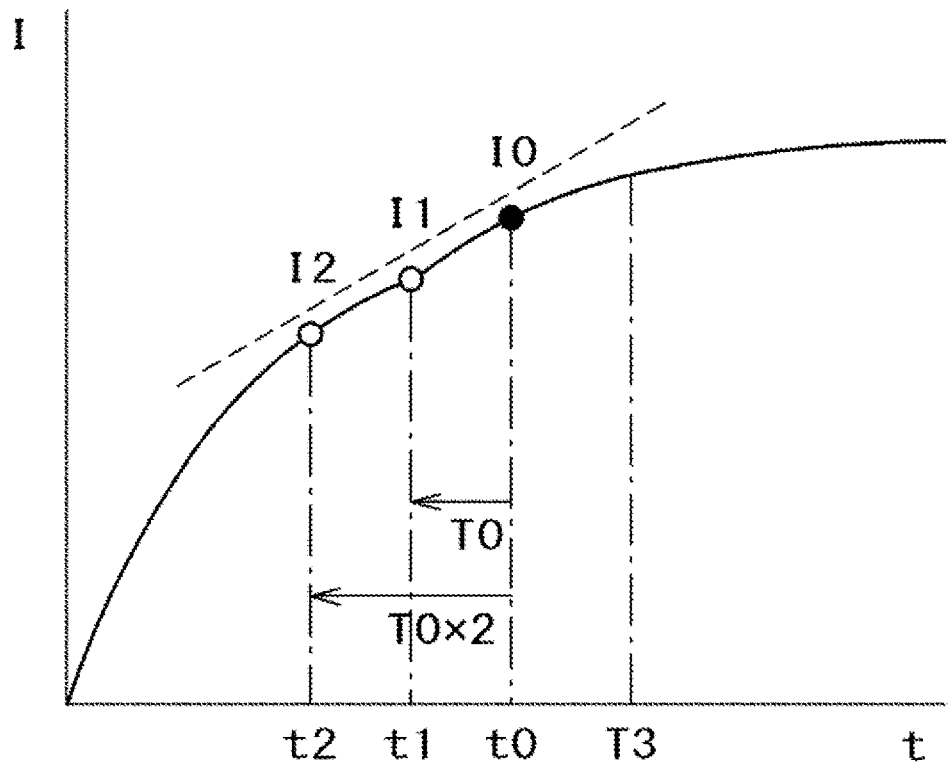
FIG. 13A and FIG. 13B are diagrams illustrating the end point detection algorithm of FIG. 11A and FIG. 11B.
Figure 13B:
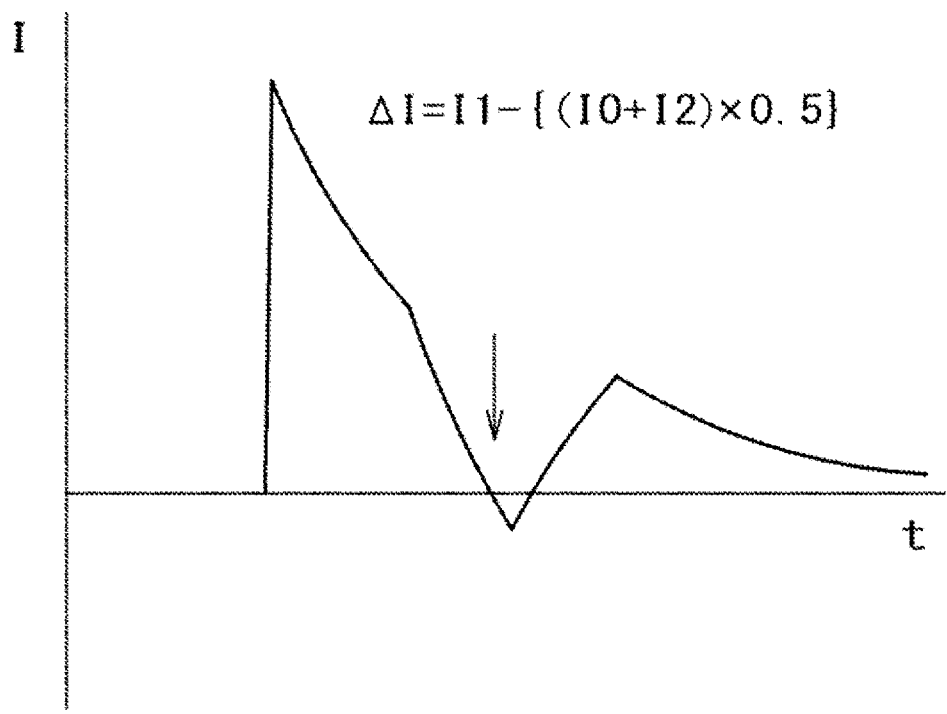

The modified example of the end point detection algorithms will be described with reference to figures. FIG. 12 is a flowchart illustrating algorithms for end-point detection of the first modified example. FIG. 13A and FIG. 13B are diagrams for explaining the end point detection algorithm of FIG. 12, FIG. 13A is a diagram showing a time change of the coil current, FIG. 13B is a diagram showing a time change of $\Delta$I.

Numerical processing programs of the first modified example, when the detected current of the present (t0) is I0, the detected current of a certain time (T0) before (t1) is I1, the detected current of twice time from the present (T0×2) before (t2) is I2, includes the process of determining the inflection point based on the time at which the value of $|\Delta I|=I1-\{(I0+I2)\times 0.5\}$ changes from positive to negative, and the variable parameter is T0.

First, as shown in FIG. 13A, when the movable iron core 11 is moved, an inflection point occurs in the time dependence of the coil current (I). This appears as a point convex down from convex on top as a graphical feature of the graph. A point where the graph is convex downward connects two points slightly apart from that point to the left and right. The point is located on the underside of a straight line. That is, as shown in FIG. 13B, the inflection point is the point where the value of $\Delta I=I1-\{(I0+I2)\times 0.5\}$ becomes negative. In reality, the calculation is carried out by the measured past current value, so that the inflection point is detected with a little delay. Time at which this inflection point is detected (t0) is about I0 in FIG. 13A, delayed T0 than the time at which the inflection point appears (t1). It corresponds to the second derivative over a wide range (T0) in order to reduce the influence of noise. There is an optimum value in T0, T0 is larger is stronger against noise, but a delay of T0 minute occurs in the end point detection as a disadvantage.

Taking advantage of this principle, an algorithm for endpoint detection is shown in the flowchart of FIG. 12.

First, the CPU21 sets the values of the parameters (T0, T3) (step S21). In FIG. 12, also considering the possibility that the end point detection does not occur, and sets the maximum time (T3). T0 and T3 of the parameter to be initially set are treated as variable parameters. These values can be set after investigating the characteristics of a given latching solenoid in advance. As described above, T0 increases the noise tolerance by increasing the value, but by that amount, the end point detection is delayed. Therefore, it is necessary to appropriately set the optimum value.

Next, the CPU21 turns on the current switch 33 by turning High the first control signal (CS1) (step S22), and stores the time (T) in a memory or the like (step S23). The CPU21 measures the current value of the time (T) (I (T)) (step S24) and stores the current value (I (T)) in SRAM2 (step S25).

Next, the CPU21 determines whether the time (T) has reached the time (T0×2) (T≥T0×2) (step S26), in the case of NO returns to the step S223, in the case of YES the process proceeds to step S27, whether the time (T) has reached the maximum time (T3) (T≤T3) is determined (step S27), in the case of NO the process proceeds to step S31, in the case of YES the process proceeds to step S28.

In step S28, the CPU21 calculates the values of $\Delta I=I(I-T0)-\{I(T-T0\times 2)+I(T)\}\times 0.5$.

Next, the CPU21 discards the values of I (T0–T0×2) stored in the SRAM23 (step S29). Next, CPU21 determines whether $\Delta I$ becomes negative in the time (T) ($\Delta I<0$) (step S30), the case of NO returns to step S23, if YES the process proceeds to step S31, the first control signal (CS1) to turn off the current switch 33 to Low.

Figure 14:
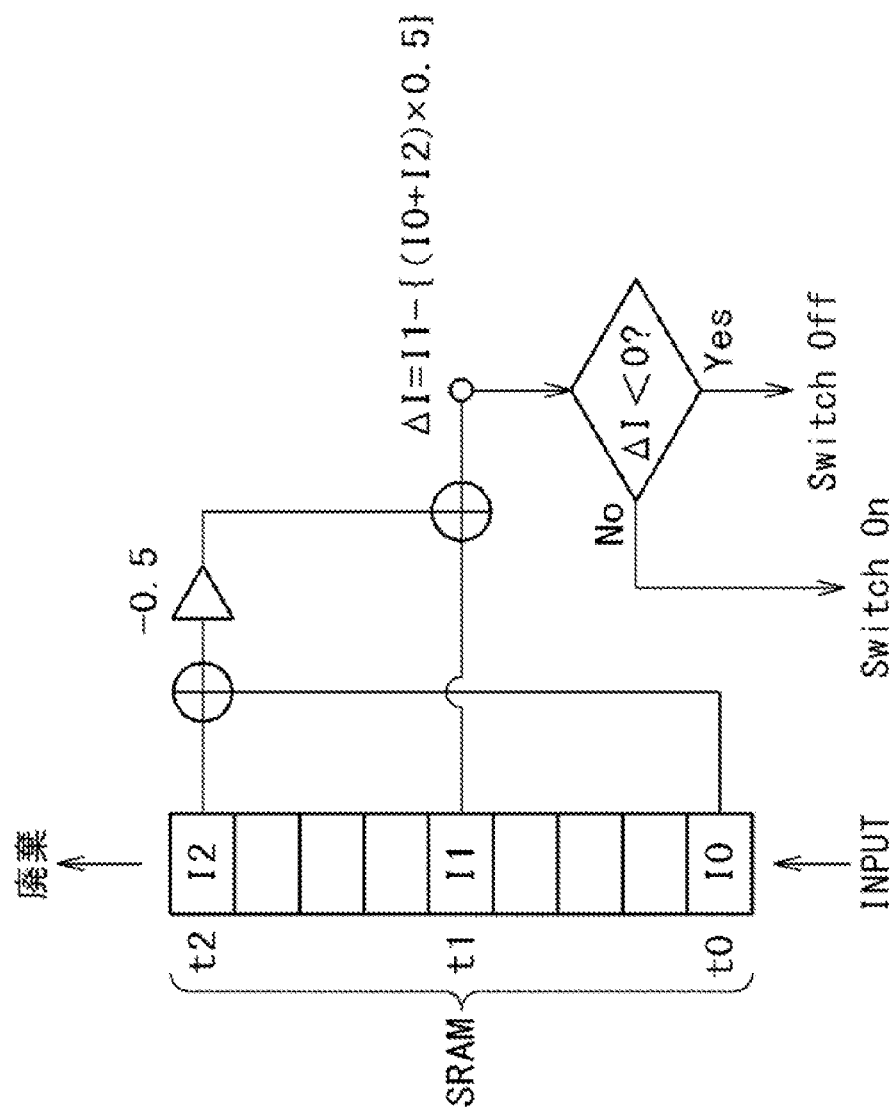
FIG. 14 is a diagram schematically illustrating the algorithms of the first modified example.

The algorithms of the present modified example require a plurality of current values to be stored on the SRAM23 when compared to the Embodiment, and the securing of storage area is required. This aspect will be described with reference to FIG. 14. FIG. 14 is a diagram schematically illustrating the algorithms of the first modified example.

The CPU21 sequentially stores the current values (I) measured for each predetermined period (T1) from t=0 to t=T3 in the SRAM23. Where T0/T1 is an integer. Therefore, the current values (I) of the T3/T1 (natural number) at most will be stored in the SRAM23.

In the algorithms of the present modified example, as shown in FIG. 14, the current value stored in the SRAM23 by measuring at t2 time (I2) and the current value stored in the SRAM23 by measuring at t0 time (I0) is added, the −0.5 is multiplied by the added value, the current value stored in the SRAM23 by measuring at t1 time to the multiplied value (I1) is added to calculate $\Delta I$. Endpoint detection based on the positive and negative of the calculated $\Delta I$, performs switching to the continuation or off of the on of the current switch 33. The current value (I2) at t2 time when the operation is completed is discarded from the SRAM23, and a new current value is entered into the SRAM23. At that time, the current values in the SRAM23 move sequentially. That is, the SRAM23 of FIG. 14 constitutes a FIFO. In the example of FIG. 14 is T0/T1=4, only eight current values are stored in the data area.

Therefore, by releasing the data area which is no longer necessary for the operation of $\Delta I$, it is possible to perform the operation in the minimum memory area.

Next, the noise tolerance of the present algorithm will be described with reference to figures. FIG. 15A and FIG. 15B are diagrams showing the characteristics of the coil current when the noise is small, FIG. 15A is a diagram showing a time change of the current of the coil, FIG. 15B is a diagram showing a time change of $\Delta I$. FIG. 16A and FIG. 16B is a diagram showing the characteristics of the current of the coil when the noise is large, FIG. 16A is a diagram showing a time change of the current of the coil, FIG. 16B is a diagram showing a time change of $\Delta I$.

FIG. 15A, as shown in FIG. 16A, even when the inflection point in the appearance becomes difficult to see, by setting the appropriate T0, FIG. 15B, as shown in FIG. 16B, it is possible to determine that $\Delta I$ is negative, it is possible to appropriately perform the endpoint detection. In the present modified example, the number of variable parameters to be initially set is less than the Embodiment.

Second Modified Example

Figure 17:
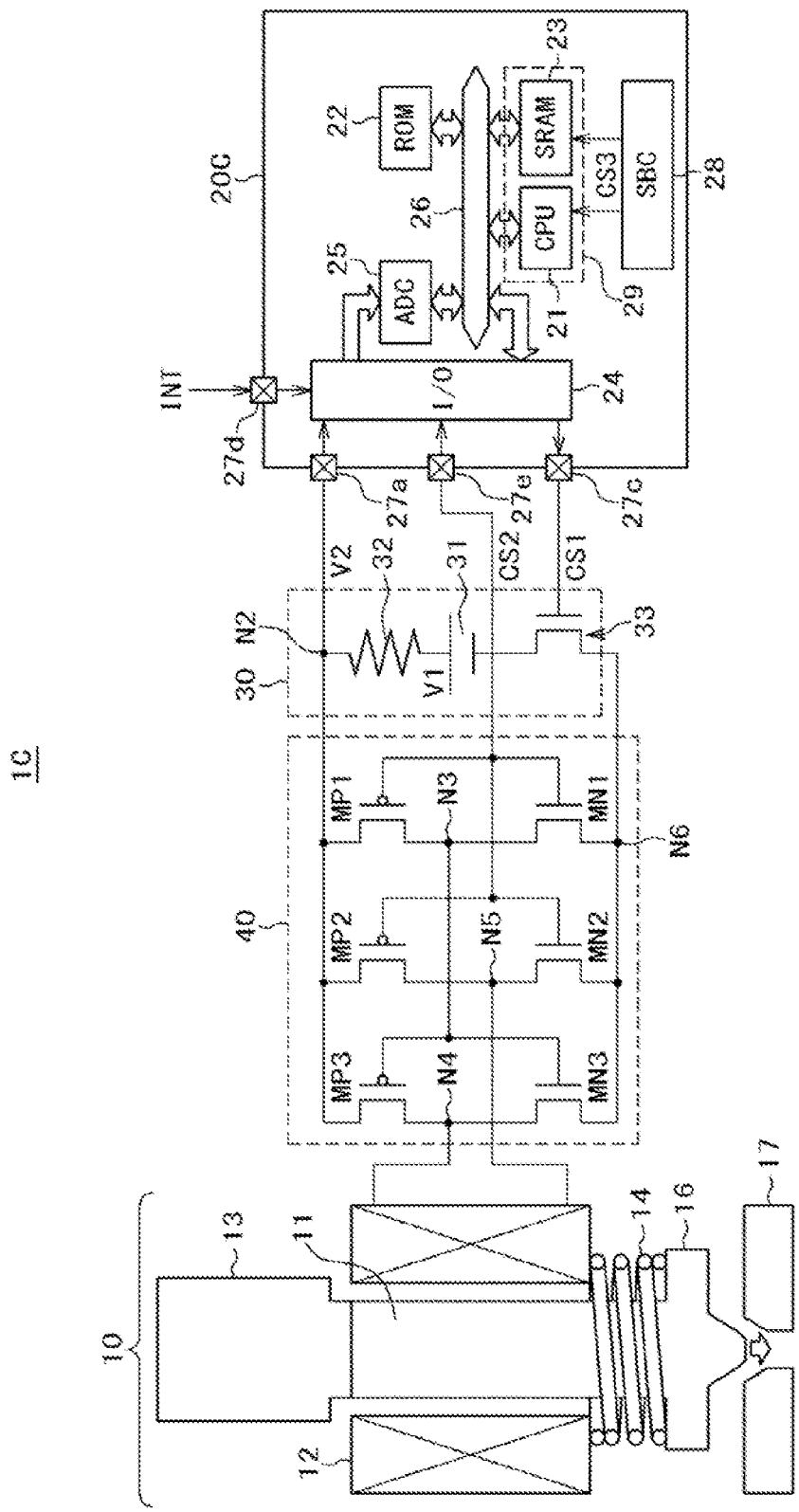
FIG. 17 is a diagram illustrating a configuration of a control system of a second modified example latching solenoid-type solenoid valve.
Figure 18:
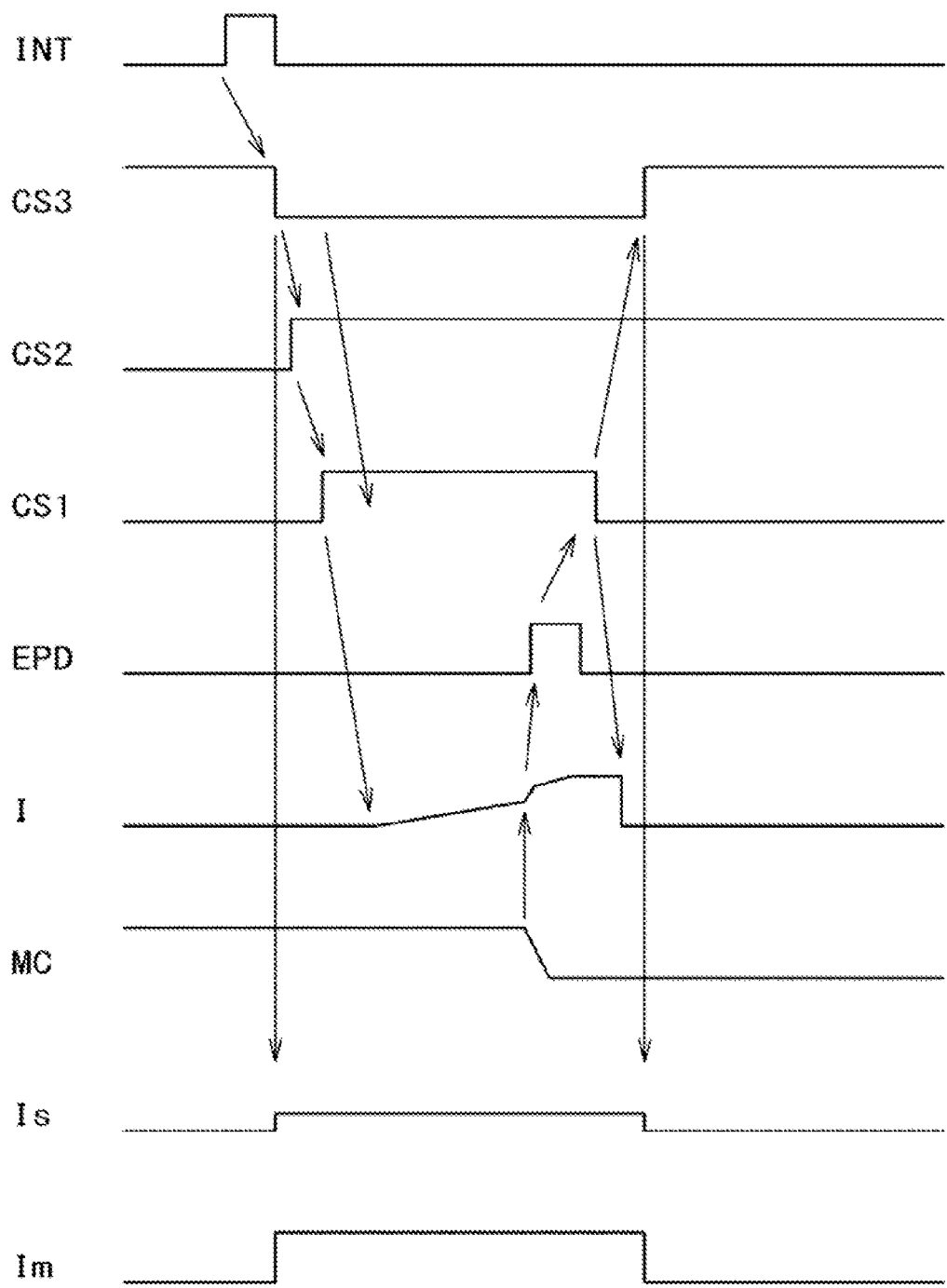
FIG. 18 is a timing diagram showing the operation of the control system of FIG. 17.
Figure 19:
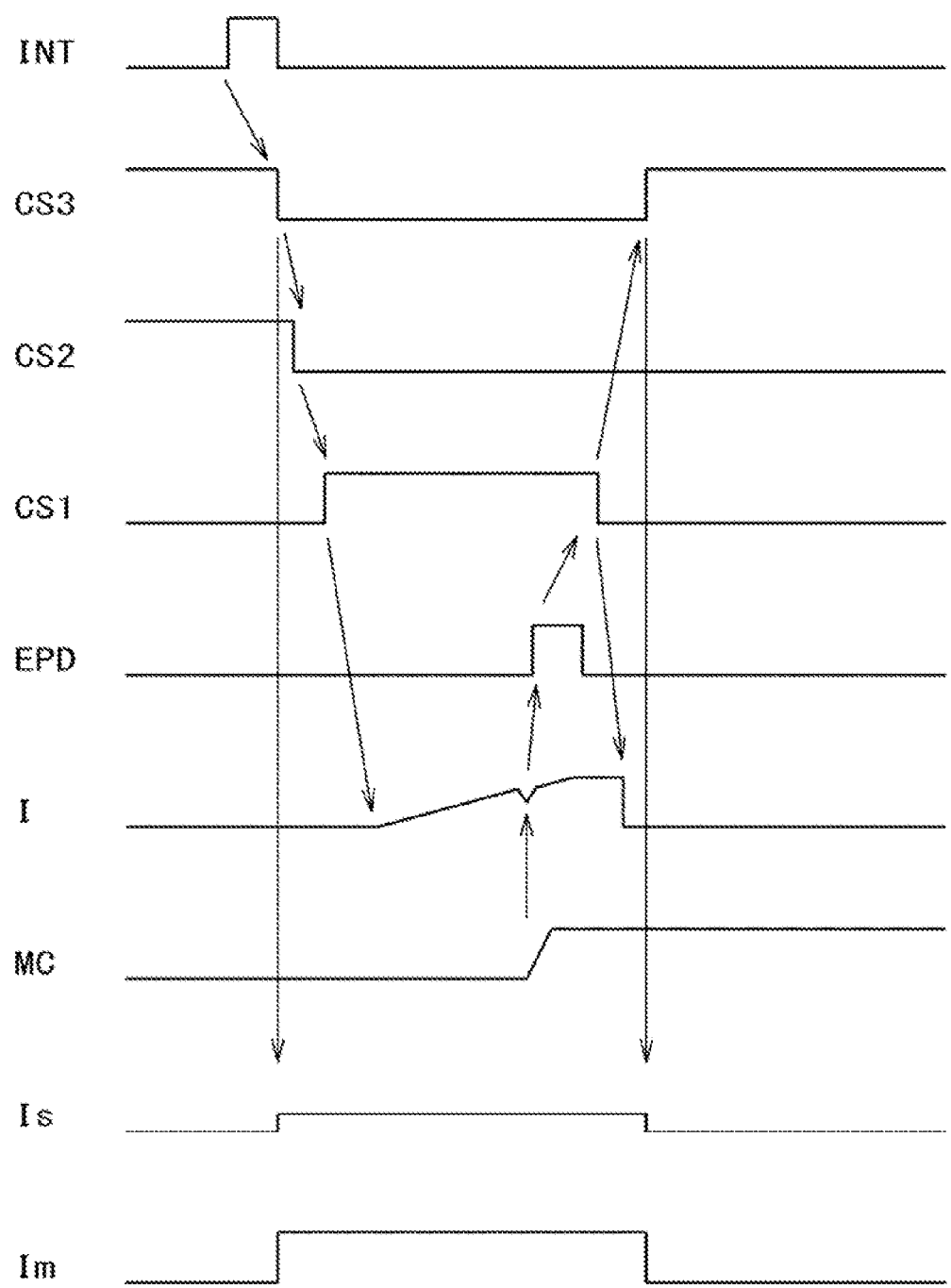
FIG. 19 is a timing diagram showing the operation of the control system of FIG. 17.

The control systems of the second modified example latching solenoid-type solenoid valve will be described with reference to figures. FIG. 17 is a diagram illustrating a configuration of a control system of a second modified example latching solenoid-type solenoid valve. FIG. 18 is a timing diagram showing the operation of the control system of FIG. 17. FIG. 19 is a timing diagram showing the operation of the control system of FIG. 17.

The control system 1C of the second modified example latching solenoid-type solenoid valve is only the microcontroller 20C differs from the Embodiment microcontroller 20, and other configurations and operations are similar to Embodiment.

Microcontroller 20C includes a substrate bias control circuit (SBC) 28 for controlling the potential of the substrate of the region 29 forming the CPU21 and SRAM23. The potential of the substrate of the region 29 is configured to be modifiable. Other configurations of microcontroller 20C are similar to Embodiment.

Next, the case where the movable iron core 11 of the operation of the control system 1C is separated from the permanent magnet 13.

As shown in FIG. 18, the microcontroller 20C, in the standby state, with the clock is stopped, the third control signal (CS3) is asserted by the substrate bias control circuit (SBC) 28, N-type well (NW) and P-type well (PW) is a substrate of the region where the CPU21 and SRAM23 are formed substrate bias is supplied (substrate bias is turned on) which is a potential different from the normal operation mode. Thus, the microcontroller 20C has a second low power consumption mode (LPM2) in which the leakage current is reduced with the clock is stopped as well as the first low power consumption mode (LPM1) of the Embodiment. In this state, when the interrupt signal (INT) input to the terminal 27d is asserted, the microcontroller 20C starts clock operation triggered thereby.

First, the substrate bias control circuit 28 negates the third control signal (CS3), supplying a potential in the normal operation mode to the N-type well (NW) and P-type well (PW) of the substrate of the region 29 where the CPU21 and SRAM23 are formed (substrate bias is turned off). This puts the microcontroller 20C into a normal mode of operation in which high-speed processing can be performed, and the CPU21 starts operating. Subsequent CPU21 performs end point detection as well as Embodiment or the first modified example.

After the CPU21 generates the end point detection signal (EPD) when the end point detection, the first control signal (CS1) is turned low to turn off the current switch 33. Thus, the coil 12 and the DC power supply 31 is separated, the current consumption from the DC power supply 31 is stopped. Thereafter, the substrate bias control circuit 28 asserts the third control signal (CS3) to turn on the substrate bias, the microcontroller 20C to low-power mode (LPM2). This reduces the leakage current of the microcontroller 20C.

Next, a description will be given of a case where the movable iron core 11 of the operation of the control system 10 is adsorbed on the permanent magnet 13.

As shown in FIG. 19, the microcontroller 20C, in the standby state, together with the clock is stopped, the third control signal (CS3) is asserted by the substrate bias control circuit (SBC) 28, N-type well (NW) and P-type well (PW) is a substrate of the region 29 where the CPU21 and SRAM23 are formed substrate bias is supplied which is a potential different from the potential in the normal operation mode (substrate bias is turned on). Thus, the microcontroller 20C is in a second low power mode (LPM2) where the leakage current is reduced. In this state, the microcontroller 20C, when the interrupt signal (INT) input to the terminal 27d is asserted, starts the operation of the clock to trigger it.

First, the substrate bias control circuit 28 negates the third control signal (CS3), supplying a potential during normal operation to the N-type well (NW) and P-type well (PW) of the substrate of the region 29 where the CPU21 and SRAM23 are formed (substrate bias is turned off). This puts the microcontroller 20C into a normal mode of operation in which high-speed processing can be performed, and the CPU21 starts operating. Subsequent CPU21 performs end point detection in the same manner as in FIG. 18.

After the CPU21 generates the end point detection signal (EPD) when the end point detection, the first control signal (CS1) is turned low to turn off the current switch 33. Thus, the coil 12 and the DC power supply 31 is separated, the current consumption from the DC power supply 31 is stopped. Thereafter, the substrate bias control circuit 28 asserts the third control signal (CS3) to turn on the substrate bias, the microcontroller 20C to the second low-power mode (LPM2). This reduces the leakage current of the microcontroller 20C.

Figure 20:
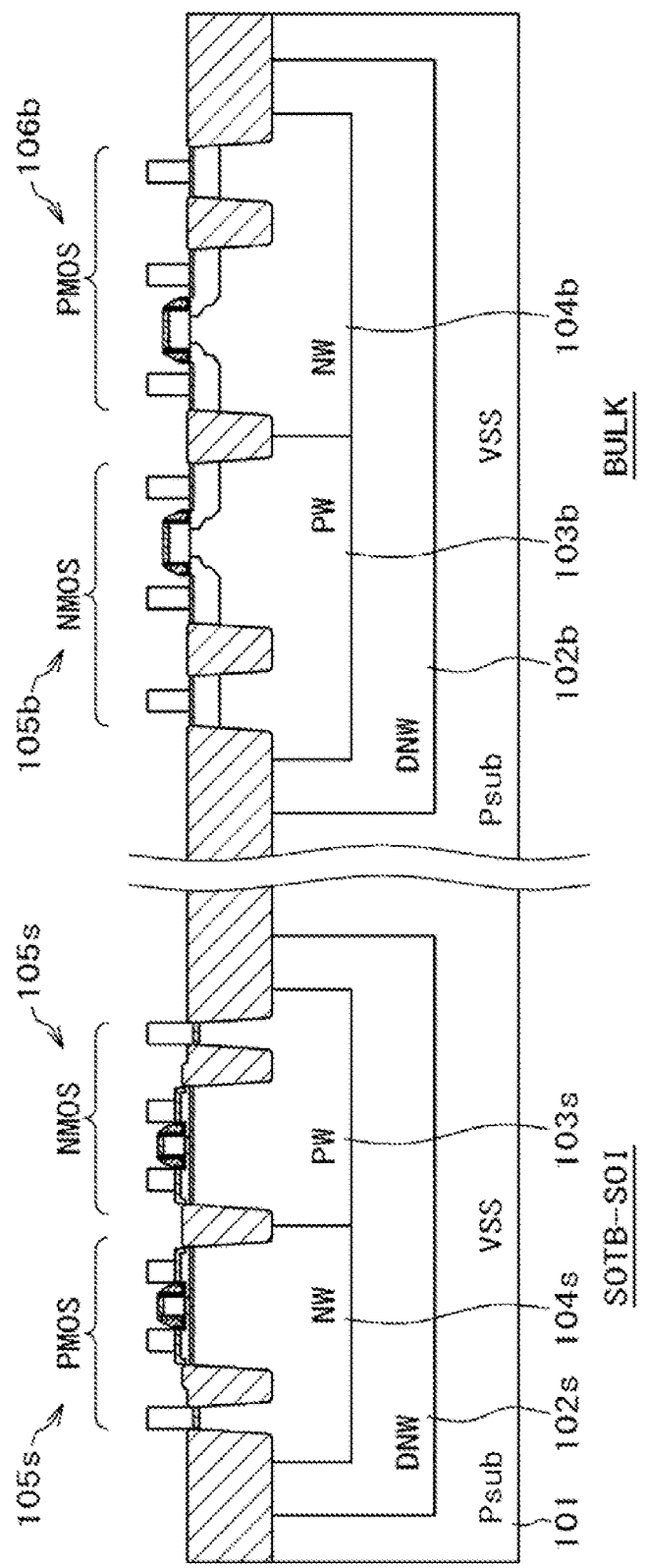
FIG. 20 is a cross-sectional view of a microcontroller.
Figure 21:
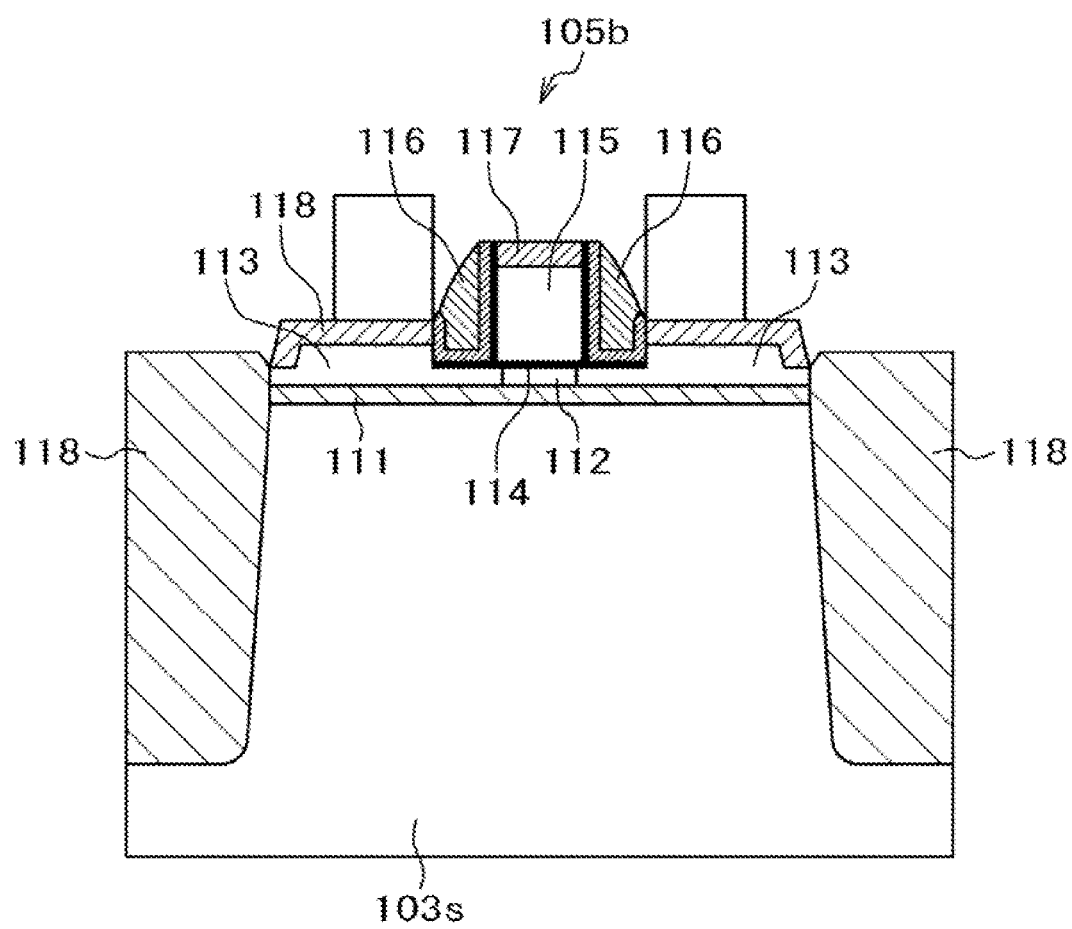
FIG. 21 is a cross-sectional view of an N-channel MOSFET of SOTB structures.
Figure 22:
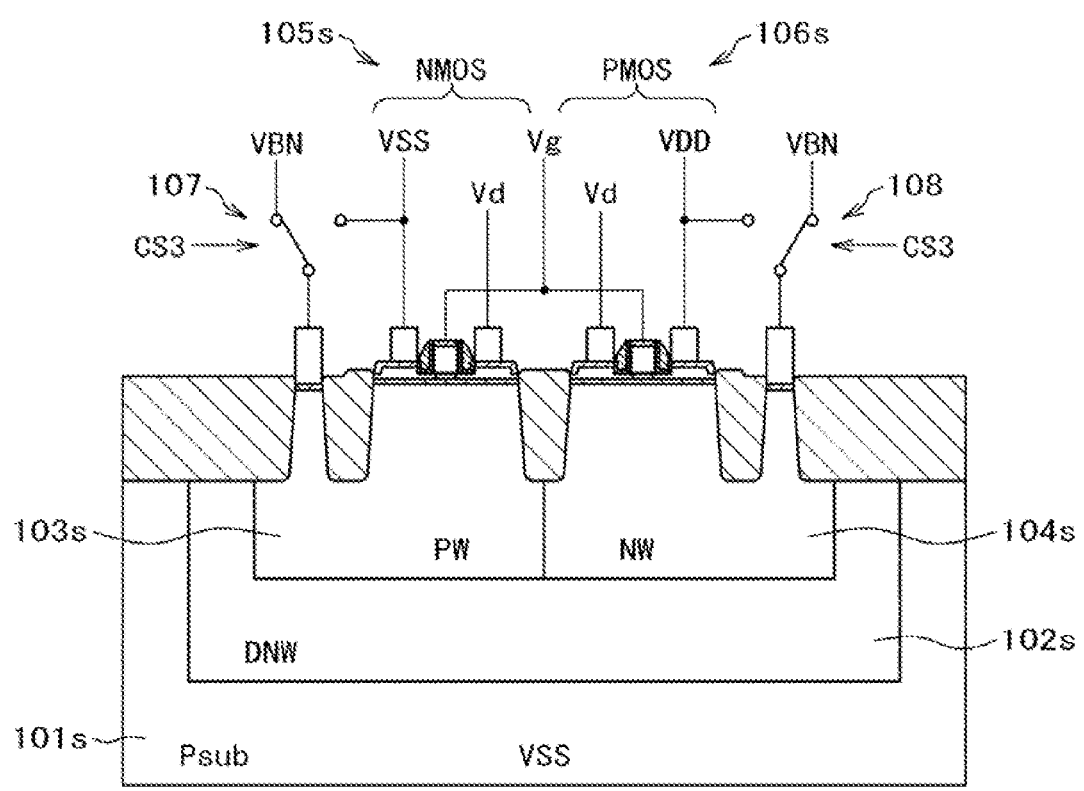
FIG. 22 is a cross-sectional view of a CMOSFET of SOTB structures.

Next, an exemplary device structure of the microcontroller of the second modified example will be described with reference to figures. FIG. 20 is a cross-sectional view of a microcontroller. FIG. 21 is a cross-sectional view of an N-channel type MOSFET of SOTB structure. FIG. 22 is a cross-sectional view of a CMOSFET of SOTB structures.

The microcontroller 20C is composed of a hybrid CMOS structure of a thin BOX-SOI structure and a bulk (BULK) structure on one semiconductor chip (semiconductor substrate). Logic and SRAM23 of low voltage operation below the 1V of the CPU21 or the like is formed in a thin BOX-SOI structure, 3. field-effect transistors for I/O circuits driven by high voltage such as 3V, an analog element such as a flash memory is formed in a bulk structure. In the bulk structure, the source, drain and channel regions of the field effect transistor are formed in a substrate such as silicon.

Thin box (SOTB: Silicon on Thin Buried Oxide) is a kind of substrate structure in which thin film silicon is laminated on an insulating film called perfect depletion type Silicon on Insulator (FD-SOI. FD-SOI is a technique that can reduce the parasitic capacitance which is one of the causes to slow the operating speed of the leakage current and field-effect transistor. Further, by thinning the insulating film called BOX (Buried Oxide) layer, substrate bias control to reduce the threshold voltage variation between the field-effect transistor can be performed, it is possible to reduce the driving voltage of the field-effect transistor. SOTB is a technique for thinning the BOX-layer to about 15 nm among the FD-SOI, it is a technique that can reduce the variation of more field-effect transistor characteristics. Furthermore the thinning effect of the BOX layer, adjacent to the field effect transistor using the SOTB, directly on the bulk silicon without using a SOTB, I/O circuit field effect transistor for high-voltage drive is required and a device such as a flash memory, it can be mixed.

As shown in FIG. 20, to form a deep N-type well (DNW) 102s, 102b in the P-type silicon substrate (Psub) 101, SOTB-SOI elements and bulk elements are power-separated. P-type well (PW) 103s and N-type well (NW) 104s are formed in the deep N-type well 102a, and N-channel type MOSFET (NMOS) 105s and P-channel type MOSFET (PMOS) 106s of SOTB-SOI structures are formed, respectively. P-type well 103b and N-type well 104b are formed in the deep N-type well 102b, N-channel type MOSFET105b of the bulk structure, respectively, P channel type MOSFET106b is formed.

As shown in FIG. 21, for example, a thin BOX layer 111 of about 10 nm is formed on the P-type well 103s, a silicon layer (SOI) is formed epitaxially on the BOX layer 111. The channel region 112 is a very thin silicon layer with a doping concentration of about 10 nm, and the source/drain 113 is formed of a raised silicon layer. An insulating film 114 comprising a high dielectric material is formed over the channel region 112, on which a polysilicon gate 115 and a sidewall 116 are formed. Silicides 116 and 117 are formed on polysilicon gate 115 and source/drain 113. Thus, N-channel type MOSFET105b is formed. The P-channel type MOSFET106b is formed similarly to the N-channel type MOSFET105b. Incidentally, the N-channel type MOSFET105b and the P-channel type MOSFET106b are separated by STI118.

Next, the control of the substrate bias will be described with reference to FIG. 22.

In the second low power consumption mode (LPM2), the potential of the VBN is supplied to the P-type well (PW) 103s, the potential of the VBP is supplied to the N-type well (NW) 104s. In the normal operation mode, the potential of VSS is supplied to the P-type well (PW) 103s, the potential of VDD is supplied to the N-type well (NW) 104s. Switching the potential supplied to the P-type well (PW) 103s and N-type well (NW) 104s by switching the switches 107 and 108 by a third control signal (CS3) from the board bias control circuit (SBC) 28. Here, VBN<VSS, VBP> is VDD, the absolute value of the board potential in the case of the second low power consumption mode (LPM2) is larger than the case of the normal operation mode.

The potential of Vs(=VSS) is supplied to the source of the N-channel type MOSFET (NMOS) 105s, the potential of Vd(=VSS~VDD) is supplied to the drain, and the potential of Vg(=VSS~VDD) is supplied to the gate. The potential of Vs(=VDD) is supplied to the source of P⁻ channel type MOSFET (NMOS) 106s, the potential of Vd(=VSS~VDD) is supplied to the drain, and the potential of Vg(=VSS~VDD) is supplied to the gate. For example, VSS=0V, VBN=−1.5V, VDD=0.79V, and VBP=2.29V.

The leakage current state of the microcontroller 20C in the second low power mode (LPM2) is 500 nA or less.

Since the Embodiment has a first low power mode (LPM1) in the microcontroller 20A, the power during that period can be reduced by a certain amount. However, since there is no mechanism (such as substrate bias control) for reducing the leakage current in the microcontroller 20A, the leakage current continues to flow for a long time. The leakage current of the microcontroller 20A is much less than the current of the coil 12, but if the percentage of the period during which the latching solenoid 15 is not operated is very large, it becomes a non-negligible power consumption. On the other hand, in the microcontroller 20C of the second modified example, since the leakage current is reduced by performing substrate biasing control, the power dissipation is extremely small even in the standby state, it can operate even in an autonomous power supply. In other words, it is possible to use a power source by "energy harvesting," a technology that "harvests" and utilizes small energy around people such as vibration, light, heat, and electromagnetic waves.

Above, the invention made by the inventors has been specifically described based on embodiments, Embodiment and modified example, the present invention is not limited to the above embodiments, Embodiment and modified example, it is needless to say that various can be changed.

For example, the second modified example has been described with reference to SOTB as a structure for controlling the substrate bias, but is not limited thereto, it may be so as to control the substrate bias in a bulk structure. An example of controlling substrate bias to reduce leakage current has also been described, but is not limited thereto, a switch may be provided between the MOS transistor and the power supply and/or ground.

What is claimed is:

1. A semiconductor device for controlling a first circuit for supplying and stopping a current supplied by a DC power supply to a latching solenoid comprising a coil, a movable iron core, and a permanent magnet, based on an input from a current detection circuit that detects the current, the semiconductor device comprising:
   a control circuit having a low power consumption mode with low leakage current and a normal operation mode;
   wherein the control circuit maintains the low power consumption mode when not flowing the current to the coil and maintains the normal operation mode when flowing the current to the coil,
   wherein the control circuit detects an inflection point of the current detected by the current detection circuit, the inflection portion indicates that the movable iron core is separated from the permanent magnet, and
   wherein the control circuit is configured to control the first circuit to stop supplying the current to the coil in response to detecting the inflection point.

2. The semiconductor device according to claim 1,
   wherein the control circuit includes a CPU and a memory for storing software programs to be executed by the CPU, and
   wherein the control circuit detects the inflection point based on a value obtained by dividing the detected current by time since the current begins to flow.

3. The semiconductor device according to claim 2,
   wherein the control circuit calculates a first value obtained by dividing a first current value measured in a first time from a start of the current flows in the first time, and a second value obtained by dividing a second current value measured in a second time from the start of the current flows in the second time, a third value obtained by a third time as a start time of the current flowing on a straight line calculated by the first time and the second time, a fourth value obtained by dividing a third current value measured at the third time by the third value, and
   wherein the control circuit detects the inflection point, when a difference between the fourth value and the third value is a predetermined value or more.

4. The semiconductor device according to claim 1,
   wherein the control circuit includes a CPU and a memory for storing software programs to be executed by the CPU, and
   wherein the control circuit detects the inflection point based on which values of $\Delta I = I1 - \{(I0+2) \times 0.5\}$ changes from positive to negative, when the current measured at t0 time is I0, the current measured before T0 time from t0 time is I1, the current measured before T0×2 hours from t0 time is I2.

5. The semiconductor device according to claim 1, wherein when the control circuit does not detect the inflection point within a predetermined time, the control circuit stops supplying the current to the coil by the first circuit.

6. The semiconductor device according to claim 1,
   wherein the control circuit transits from the low power consumption mode to the normal operation mode, and flows the current to the coil by the first circuit, and
   wherein the control circuit stops flowing the current to the coil by the first circuit based on detecting the inflection point, and transits from the normal operation mode to the low power consumption mode.

7. The semiconductor device according to claim 6,
   further comprising a substrate bias control circuit,
   wherein in the low power consumption mode, the substrate bias control circuit controls an absolute value of a substrate potential of a field-effect transistor constituting the control circuit to be larger than that in the normal operation mode.

8. The semiconductor device according to claim 7, wherein the field-effect transistor is formed on an SOTB substrate which laminates a thin film silicon on an insulating film.

9. The semiconductor device according to claim 8, wherein the latching solenoid is driven by an autonomous power supply.

10. The semiconductor device according to claim 1,
    wherein the control circuit, while changing a direction of the current flowing through the coil by controlling a second circuit, and
    wherein the control circuit detects the inflection point of the current detected by the current detecting circuit when the movable iron core is adsorbed on the permanent magnet.

11. A semiconductor device for measuring a current while controlling the current supplied by a DC power supply to a latching solenoid comprising a coil, a movable iron core and a permanent magnet, the semiconductor device comprising:
    a first circuit for supplying/stopping the current;
    a second circuit for controlling a direction of the current flowing through the coil,
    a microcontroller for controlling the first circuit and the second circuit, the microcontroller including a CPU;
    a memory for storing a software program executed by the CPU; and an A/D converter for converting a voltage of a resistor connected in series with the DC power supply and the coil from an analog signal to a digital signal,
wherein the microcontroller is configured to detect an inflection point of the current based on the digital signal indicating the voltage from the A/D converter to determine whether the movable iron core is apart from the permanent magnet.

12. The semiconductor device according to claim 11, wherein when the microcontroller detects the inflection point, the microcontroller is configured to control the first circuit to stop supplying the current to the coil.

13. The semiconductor device according to claim 12, wherein the microcontroller has a low power consumption mode with a reduced leakage current and a normal operation mode.

14. The semiconductor device of claim 13, wherein the microcontroller is a semiconductor device that maintains said low power consumption mode when no current is flowing through said coil and said normal operation mode when current is flowing through said coil.

15. The semiconductor device according to claim 13, wherein the microcontroller transitions from the low power consumption mode to the normal operation mode and flows the current through the coil by the first circuit, and
wherein the microcontroller stops flowing the current to the coil by the first circuit based on detecting the inflection point, and transits from the normal operation mode to the low-power consumption mode.

16. The semiconductor device according to claim 15, further comprising a substrate bias control circuit,
wherein in the low power consumption mode, the substrate bias control circuit controls an absolute value of a substrate potential of a field-effect transistor constituting the CPU to be larger than that in the normal operation mode.

17. The semiconductor device according to claim 16, wherein the field effect transistor is formed on an SOTB substrate which laminates a thin film silicon on an insulating film.

* * * * *